United States Patent [19]

Nishino et al.

[11] Patent Number: 4,730,165
[45] Date of Patent: Mar. 8, 1988

[54] NON-LINEAR SIGNAL PROCESSING APPARATUS

[75] Inventors: Masakazu Nishino, Fujiidera; Kiyokazu Hashimoto, Matsubara, both of Japan

[73] Assignee: Matsushita Electric Industrial Co., Ltd., Osaka, Japan

[21] Appl. No.: 773,673

[22] Filed: Sep. 9, 1985

[30] Foreign Application Priority Data

Sep. 12, 1984 [JP] Japan ................................. 59-191018
Dec. 24, 1984 [JP] Japan ................................. 59-277106

[51] Int. Cl.⁴ ........................ G06G 7/12; H03G 7/00; H04B 1/00
[52] U.S. Cl. .................................... 328/142; 307/490; 307/494; 333/14; 455/72
[58] Field of Search ................. 307/494, 490, 542; 333/14, 15; 455/72; 328/142

[56] References Cited

U.S. PATENT DOCUMENTS

| 4,187,478 | 2/1980 | Endoh et al. | 333/14 |
| 4,224,581 | 9/1980 | Watanabe et al. | 333/14 |
| 4,451,746 | 5/1984 | Hirose et al. | 307/542 |

Primary Examiner—Stanley D. Miller
Assistant Examiner—B. P. Davis
Attorney, Agent, or Firm—Spencer & Frank

[57] ABSTRACT

A non-linear signal processing apparatus used in a video tape recorder or a video disk player is disclosed. The time variation of an input signal or a processed version thereof is non-linearly processed by a differential circuit and a closed loop including a non-linear circuit. The non-linearly processed time variation of the signal or a processed version thereof is arithmetically combined with the input signal. Thus, the same non-linear characteristic as that obtained by the prior art analog signal technique is attained by the digital signal processing technique, which is superior in integrity and stability. By appropriately selecting the characteristic of the non-linear circuit, better results than those obtainable by the analog signal processing technique are achieved.

41 Claims, 21 Drawing Figures

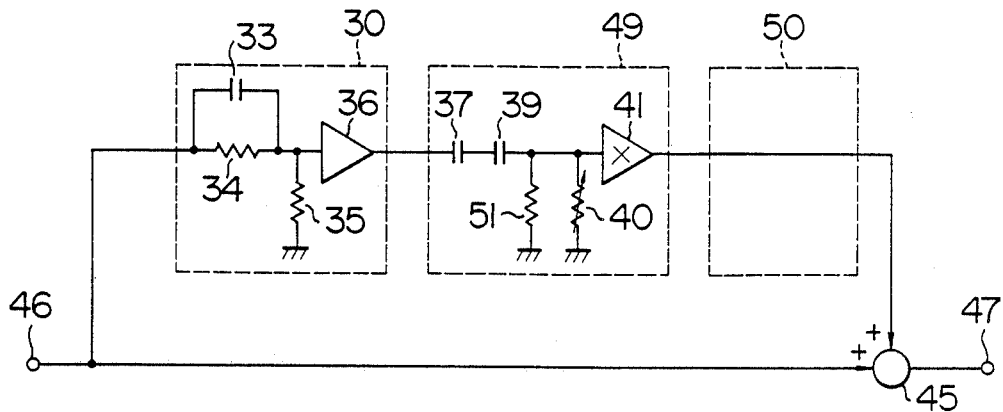
F I G. 10
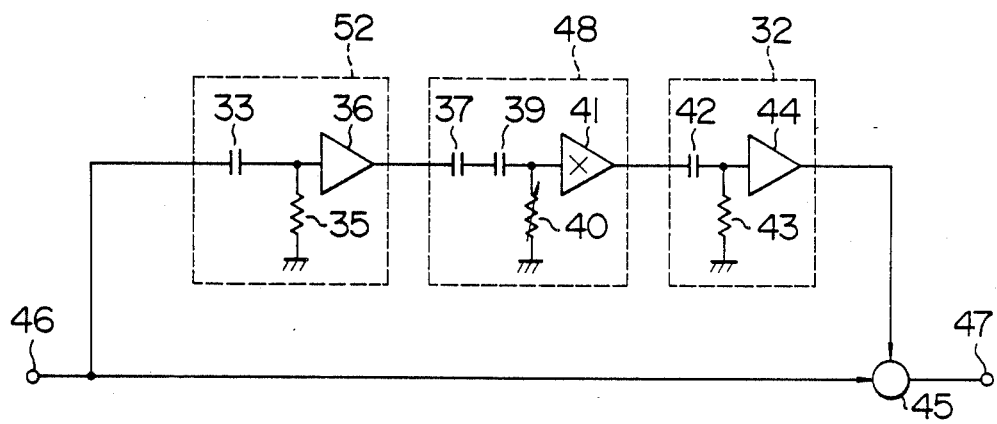
F I G. 11
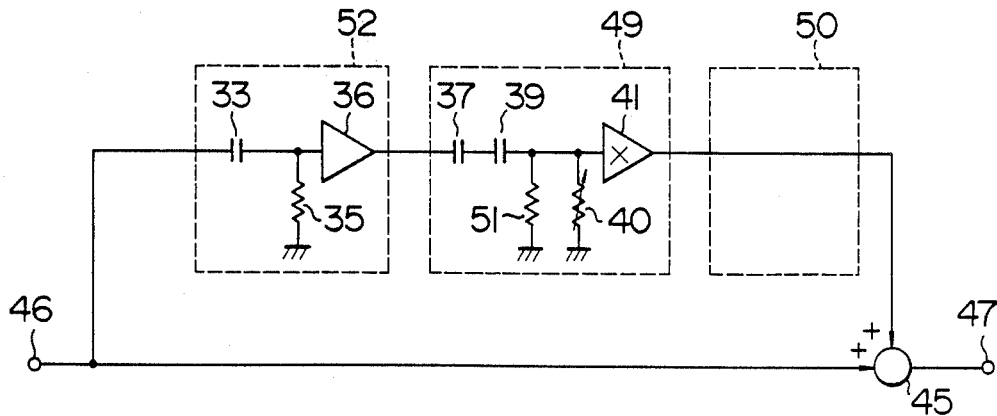
F I G. 12

NON-LINEAR SIGNAL PROCESSING APPARATUS

BACKGROUND OF THE INVENTION

The present invention relates to a non-linear signal processing apparatus which is applicable to a video tape recorder or a video disk player.

In a non-linear signal processing apparatus, non-linear emphasis is made to emphasize a high frequency band of a video signal to secure a desired S/N ratio in the high frequency band, and the degree of the high frequency emphasis is lowered only when a high energy component is contained in the high frequency band in order to prevent adverse effects due to overemphasis. FIG. 1 shows an example of the non-linear emphasis circuit. Numeral 1 denotes a first connection which is a parallel connection of a capacitor 2 and a resistor 3, numeral 4 denotes a second connection in which a pair of anti-parallelly connected diodes 5 and 6 are connected in series with a capacitor 7 and this series connection is connected in parallel to a resistor 8, numeral 9 denotes an input terminal, numeral 10 denotes an output terminal and numeral 11 denotes an amplifier for adjusting a level of an output signal. The capacitors 2 and 7 have capacitances C1 and C2, respectively, and the resistors 3 and 8 have resistances R1 and R2. They have the relationship C1R1=C2R2. Since a current flowing through the anti-parallal connection of the pair of diodes 5 and 6 varies with the voltage applied thereacross, the anti-parallel connection of the diodes 5 and 6 is considered as a variable resistor having a resistance Rd which varies from a conductor to an infinite resistor depending on the voltage applied thereacross. The amplifier 11 has an amplification factor of (R1+R2)/R2, which is a reciprocal of a voltage division factor R2/(R1+R) by the resistors 3 and 8, in order to render the signal levels of the input signal the and the output signal same.

In operation, if the signal level of the input signal applied to the input terminal 9 is sufficiently low, the voltage across the anti-parallel connection of the diodes 5 and 6 is also low and little current flows therethrough. Accordingly, the internal resistance Rd is infinite. As a result, the second connection 4 is equivalent to mere resistor 8 and the circuit of FIG. 1 presents an emphasis characteristic which emphasizes the high frequency band as shown by a gain characteristic A of FIG. 2. As the signal level of the input signal increases, the voltage across the anti-parallel connection of the diodes 5 and 6 increases and the current starts to flow. If the signal level of the input signal is sufficiently high, the current flowing through the anti-parallel connection of the diodes 5 and 6 increases and the internal resistance becomes conductive. As a result, the second connection is equivalent to a parallel connection of the resistor 8 and the capacitor 7. The impedences of the second connection 4 and the first connection 1 are equal because the relationship of C1R1=C2R2 and the gain characteristic is constant as shown by B in FIG. 2.

The above operation is explained by using a Laplace transform formula which represents a continuous time system. The transfer function H(S) of the circuit of FIG. 1 is represented by C1, C2, R1, R2 and Rd as follows.

$$H(S) = \frac{(R1 + R2)(HC1R1S)(1 + C2RdS)}{(R1 + R2 + C1R1R2S)(1 + C2RdS) + C2R1R2S} \quad (1)$$

X, T and Td are defined as follows.

$$X = R1/R2 \quad (2)$$

$$T = C1R1 = C2R2 \quad (3)$$

$$Td = C2Rd \quad (4)$$

H(S) is represented by X, T and Td as follows.

$$H(S) = \frac{(1 + X)(1 + TS)(1 + TdS)}{(1 + X)(1 + TS) + (1 + X + TS)} \quad (5)$$

or $$H(S) = 1 + \frac{XTS \cdot TdS}{(1 + X)(1 + TS) + (1 + X + TS)TdS} \quad (6)$$

When the signal level of the input signal is sufficiently low, the resistance Rd is infinite, and Td is also infinite from the formula (4). By putting Td as infinite in the formula (6), H(S) is represented as follows.

$$H(S) = 1 + \frac{XTS}{1 + X + TS} \quad (7)$$

The second term on the right side of the formula (7) represents a high-pass filter, and H(S) presents the emphasis characteristic which emphasizes the high frequency band.

When the signal level of the input signal is sufficiently high, the resistance Rd is conductive or zero and Td is also zero from the formula (4). By putting Td as zero in the formula (6), $$H(S) = 1 \quad (8)$$

which represents a flat gain characteristic.

The non-linear emphasis of FIG. 1 emphasizes the high frequency band of the input signal when the signal level thereof is low, but as the signal level of the input signal increases, the degree of the high frequency emphasis is lowered. When it is used in a VRT or a video disk player, it improves the S/N ratio in the high frequency band while it prevents effects due to overemphasis.

However, a non-linear signal processing apparatus such as the non-linear emphasis circuit described above employs analog signal processing techniques. It is inferior to a digital IC from the standpoints of integrity and stability. It is not easy from standpoints of circuit scale and speed to realize, by a digital signal processing technique, an apparatus which non-linearly controls a frequency characteristic in accordance with the signal level of an input signal such as a video signal which spreads over a wide band.

SUMMARY OF THE INVENTION

It is an object of the present invention to provide a non-linear signal processing apparatus which has an equal or better non-linear characteristic than that of a conventional analog signal processing apparatus and can be implemented by a digital signal processing technique which provides high integrity and high stability.

In order to achieve the above object, the non-linear signal processing apparatus of the present invention comprises a first signal processing circuit for processing an input signal in a predetermined manner, a non-linear signal processing circuit which includes a differential circuit for extracting a variation in a predetermined time period from an output signal of the first processing circuit, a non-linear circuit for non-linearly compressing the amplitude of a signal in accordance with the amplitude of the signal, a delay circuit for delaying an output signal of the delay circuit by a predetermined time period, an order circuit for combining the output signal of the delay circuit and the output signal of the differential circuit and supplying the combined signal to the non-linear circuit, and a multiplier circuit for multiplying the output signal of the non-linear circuit by a predetermined factor; a second signal processing circuit for processing the output signal of the non-linear signal processing circuit in a predetermined manner; and an arithmetic operation circuit for arithmetically operating the output signal of the second signal processing circuit and the input signal to the first signal processing circuit. The present non-linear signal processing apparatus presents a non-linear characteristic by using the digital signal processing technique.

BRIEF DESCRIPTION OF THE DRAWINGS

The present invention will be apparent from the following detailed description taken in conjunction with the accompanying drawings, in which:

FIG. 10 shows a circuit model for illustrating the operation of a second embodiment of the present invention;

FIG. 11 shows a circuit model for illustrating the operation of a third embodiment of the present invention;

FIG. 12 shows a circuit model for illustrating the operation of a fourth embodiment of the present invention;

DESCRIPTION OF THE PREFERRED EMBODIMENTS

Figure 3:
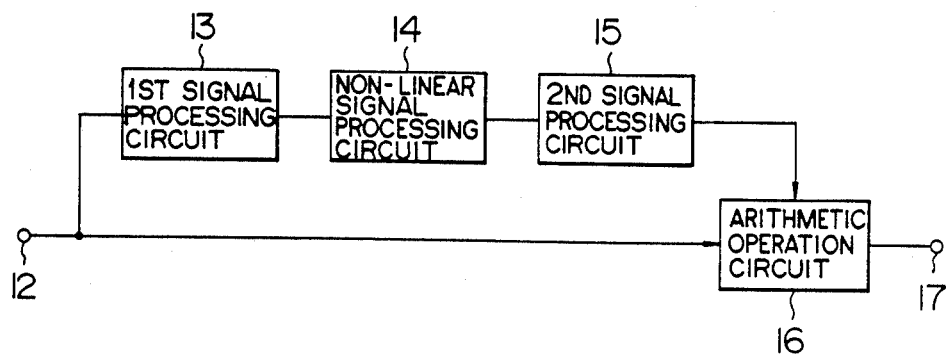
FIG. 3 is a block diagram of a non-linear signal processing apparatus of the present invention.

FIG. 3 is a block diagram showing an basic configuration of the non-linear signal processing apparatus of the present invention. In FIG. 3, numeral 12 denotes an input terminal for a video signal which is digitized at a sampling period of Δ, numeral 13 denotes a first signal processing circuit for pre-processing the input video signal, numeral 14 denotes a non-linear signal processing circuit for non-linearly processing the output signal of the first signal processing circuit 13, numeral 15 denotes a second signal processing circuit for post-processing the output signal of the non-linear signal processing circuit 14, numeral 16 denotes an arithmetic operation circuit for arithmetically operating the input signal applied to the input terminal 12 and the output signal of the second signal processing circuit 15, and numeral 17 denotes an output terminal from which the output signal of the arithmetic operation circuit 16 is outputted as an output signal of the present non-linear signal processing apparatus.

Figure 4:
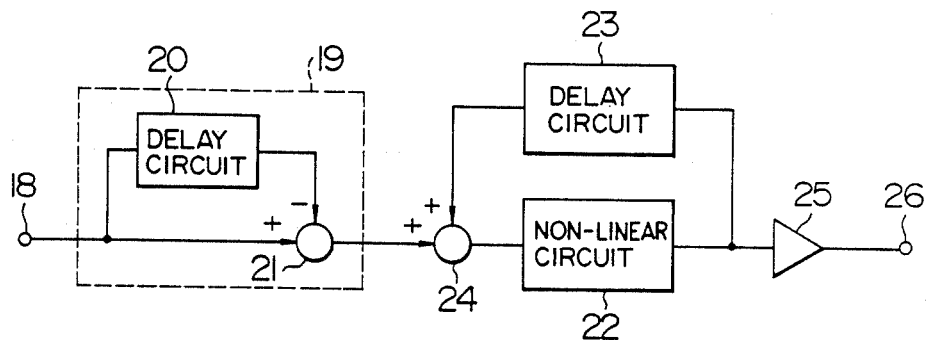
FIG. 4 is a block diagram of a non-linear signal processing circuit for the non-linear signal processing apparatus of the present invention.

FIG. 4 is a block diagram showing the configuration of the non-linear signal processing circuit 14. In FIG. 4, numeral 18 denotes an input terminal of the non-linear signal processing circuit 14, to which the output signal of the first signal processing circuti 13 is applied, numeral 19 denotes a differential circuit which extracts a signal variation per a time period corresponding to n times (n being an integer) as long as the sampling period Δ and comprises a delay circuit 20 for delaying the signal by the n times of the sampling period (nΔ) and a subtractor circuit 21 for subtracting the output signal of the delay circuit 20 from the input signal to the delay circuit 20, numeral 22 denotes a non-linear circuit which compresses the amplitude of a signal in accordance with the amplitude of the signal with a compression factor of F, numeral 23 denotes a delay circuit for delaying the output signal of the non-linear circuit 22 by the time period of nΔ, numeral 24 denotes an adder circuit for combining the output signal of the differential circuit 19 and the output signal of the delay circuit 23 and supplying the combined signal to the non-linear circuit 22, numeral 25 denotes a multiplier circuit for multiplying the output signal of the non-linear circuit 22 with a predetermined factor K, and numeral 26 denotes an output terminal of the non-linear signal processing circuit 14. The output signal from the terminal 26 is supplied to the second signal processing circuit 15.

Figure 5:
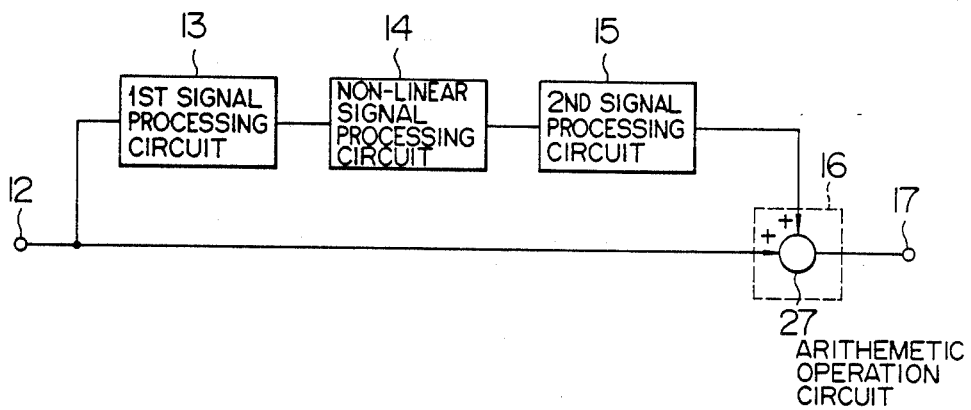
FIG. 5 shows a block diagram of a linear signal processing apparatus having a non-linear emphasis characteristic in accordance with one embodiment of the present invention.

In a first embodiment of the non-linear signal processing apparatus of the present invention, the non-linear signal processing circuit functions as the non-linear emphasis circuit. FIG. 5 shows a block diagram of the non-linear signal processing apparatus in accordance with the present embodiment. The configuration is same as the basic configuration shown in FIG. 3 and the terminals and the blocks as designated by the same numerals as those shown in FIG. 3. The arithmetic operation circuit 16 in the present embodiment functions to combine the input signal applied to the input terminal 12 and the output signal of the second signal processing circuit 15. The arithmetic operation circuit 16 is therefore described as an adder circuit 27. The operation of the non-linear signal processing apparatus of the present embodiment is explained with reference to the circuit model and a transfer function which represents a characteristic of the circuit. The transfer function uses a Laplace transform formula which represents a continuous time system and a Z-transform formula which represents a discrete time system by using a delay operator $Z^{-1}$ which shows the delay of the signal in one sampling period $\Delta$.

Figure 1:
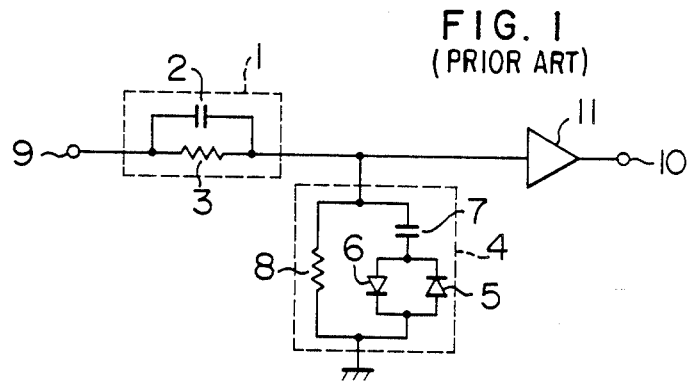
FIG. 1 shows a circuit model of a non-linear emphasis circuit which is one of the prior art non-linear signal processing apparatus.
Figure 6:
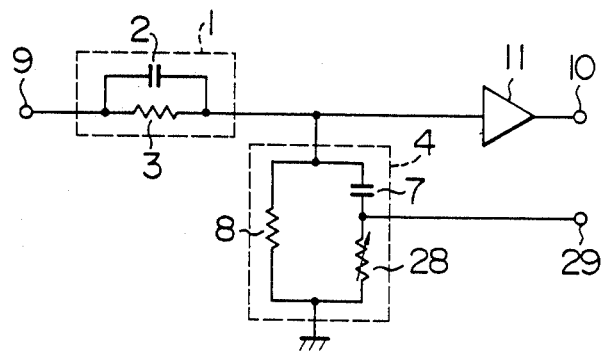
FIGS. 6, 7 and 8 show circuit models for illustrating the operation of the first embodiment.

In FIG. 6, the anti-parallel connection of the diodes 5 and 6 in the non-linear emphasis circuit of FIG. 1 is replaced by a potentiometer 28. The resistance Rd of the potentiometer 28 varies equivalently to the internal resistance of the anti-parallel connection of the diodes 5 and 6, by a voltage applied to a terminal 29. A transfer function H(S) of the output signal at the output terminal 10 to the input signal applied to the input terminal 9 is represented by the formulas (1), (5) and (6) and a transfer function Hd(S) of the signal at the terminal 29 is expressed as follows.

$$Hd(S) = \frac{(1 + C1R1S)C2R2RdS}{(R1 + R2 + C1R1R2S)(HC2RdS) + C2R1R2S} \quad (9)$$

From the formulas (2), (3) and (4) and by using X, T and Td, we get $$Hd(S) = \frac{(1 + TS)TdS}{(1 + X)(1 + TS) + (1 + X + TS)TdS} \quad (10)$$

By substituting Hd(S) in the formula (6), $$H(S) = 1 + X \cdot Hd(S) \cdot \frac{TS}{1 + TS} \quad (11)$$

$H_1(S)$, $H_2(S)$ and $H_3(S)$ are defined as follows.

$$H_1(S) = \frac{1 + TS}{1 + X + TS} \quad (12)$$

$$H_2(S) = \frac{(1 + X + TS) \cdot XTdS}{(1 + X)(1 + TS) + (1 + X + TS)TdS} \quad (13)$$

$$H_3(S) = \frac{TS}{1 + TS} \quad (14)$$

From the formulas (12), (13) and (14), XHd(S) the right side of the formula (11) is expressed by $$XHd(S) = H_1(S) \cdot H_2(S) \quad (15)$$

and H(S) is expressed by $$H(S) = 1 + H_1(S) \cdot H_2(S) \cdot H_3(S) \quad (16)$$

Figure 7:
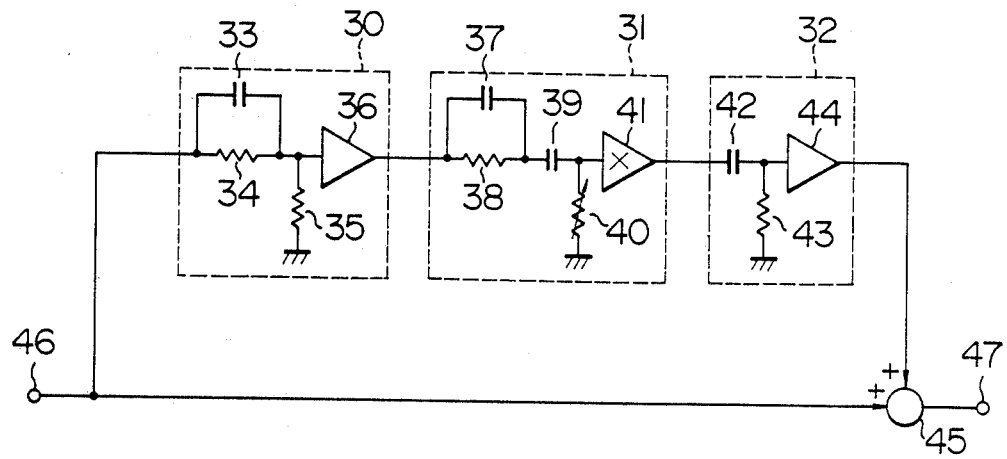

The formula (16) is represented by the circuit model shown in FIG. 7, in which numeral 30 denotes a circuit model for $H_1(S)$, numeral 31 denotes a circuit model for $H_2(S)$, and numeral 32 denotes a circuit model for $H_3(S)$. Capacitors 33 and 37 each has a capacitance C1, capacitors 39 and 42 each has a capacitance C2, a resistor 34 has a resistance R1, resistors 35 and 43 each has a resistance R2, a resistor 38 has a resistance R1·R2/(R1+R2) (the resistor 38 is a parallel connection of R1 and R2), and a potentiometer 40 has a resistance Rd. Numerals 36 and 44 denote buffers, numeral 41 denotes an amplifier having an amplification factor X (=R1/R2), numeral 45 denotes an adder and numerals 46 and 47 denote input terminal and output terminal, respectively.

The circuit model 30 for $H_1(S)$ presents the non-linear emphasis characteristic of the circuit model of FIG. 6 where the potentiometer 28 is infinite, that is, the signal level of the input signal is sufficiently low. The circuit model 31 for $H_2(S)$ forms a combined impedance of the circuit model 30 for $H_1(S)$ by the parallel connection of the capacitor 37 and the resistor 38 and forms a high-pass filter by the capacitor 39 and the potentiometer 40. If the signal level is sufficiently low, the resistance Rd of the potentiometer 40 is infinite and the high frequency component is passed as it is, but when the signal level increases, Rd reduces and the amplitude is non-linearly compressed. The circuit model 32 for $H_3(S)$ forms a high-pass filter which functions to adjust a level when the output signal thereof is combined with the input signal applied to the terminal 46 in the adder 45.

Figure 8:
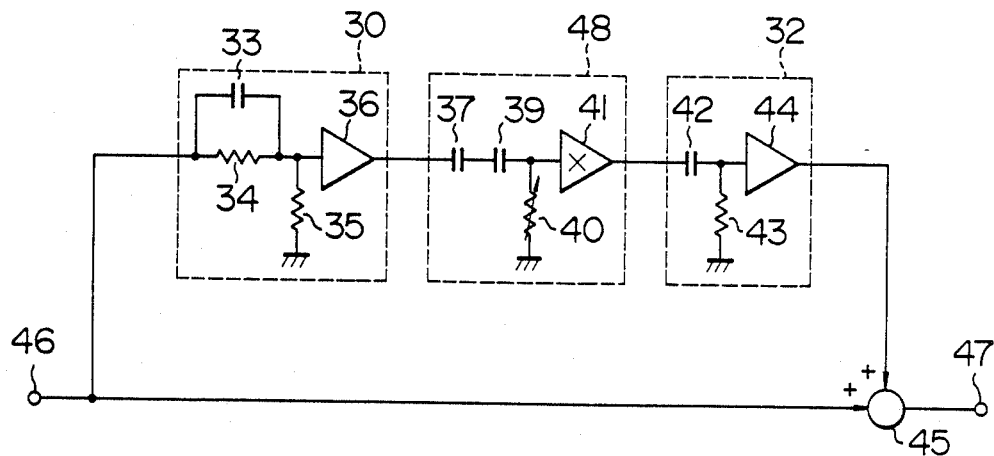

Let us consider the circuit model 31 for $H_2(S)$. The capacitor 39 and the potentiometer 40 form the high-pass filter which extracts only the high frequency component of the signal. In order to simplify the circuit, the parallel connection of the capacitor 37 and the resistor 38 inserted before the capacitor 39 is approximated by a capacitor which does not pass a low frequency component. The impedance of the capacitor is, in general, determined by the angular frequency of the signal. Accordingly, in order to determine the capacitance of the approximate capacitor, an angular frequency at which a highest precision for approximation is required is selected. For example, if the angular frequency is selected to a resonance angular frequency of the parallel connection of the capacitor 37 and the resistor 38, the capacitance is equal to $\sqrt{2}$ Cl, and if it is selected to an infinite frequency, the capacitance is equal to C1. For the purpose of explanation, the capacitance of C1 is considered. The approximation of the parallel connection of the capacitor 37 and the resistor 38 by the capacitor having the capacitance C1 is nothing but to eliminate the resistor 38. It is shown in FIG. 8, in which a circuit model 48 in the circuit model 31 of FIG. 7 with the resistor 38 being removed. A transfer function $H_4(S)$ is represented by $$H_4(S) = \frac{XTdS}{1 + X + TdS} \quad (17)$$

The circuit model of the non-linear emphasis circuit shown in FIG. 8 is converted to a discrete time system.

An S-Z transform method which transforms a Laplace transform formula to a Z-transform formula includes various effective methods such as differential method or a bi-linear transform method. In the following description, the simplest differential method is used to effect the S-Z transform. In the differential method, the fact that S in the Laplace transform formula is a differentiation operator is utilized and S is replaced by the differential operator in the Z-transform formula. The differential transform is represented by the delay operator $Z^{-1}$ and the sampling period $\Delta$ as follows.

$$S = \frac{1 - Z^{-1}}{\Delta} \tag{18}$$

The circuit models $H_1(S)$, $H_4(S)$ and $H_3(S)$ of FIG. 8 are S-Z transformed by using the formula (18) to obtain $H_1(Z)$, $H_4(Z)$ and $H_3(Z)$.

$$H_1(Z) = \frac{1 + \frac{T}{\Delta}(1 - Z^{-1})}{1 + X + \frac{T}{\Delta}(1 - Z^{-1})} \tag{19}$$

$$H_4(Z) = \frac{\frac{XTd}{\Delta}(1 - Z^{-1})}{1 + X + \frac{Td}{\Delta}(1 - Z^{-1})} \tag{20}$$

$$H_3(Z) = \frac{\frac{T}{\Delta}(1 - Z^{-1})}{1 + \frac{T}{\Delta}(1 - Z^{-1})} \tag{21}$$

From the formulas (19), (20) and (21), the transfer function $H(Z)$ of the non-linear signal processing apparatus of FIG. 5 is expressed as follows.

$$H(Z) = 1 + H_1(Z) \cdot H_4(Z) \cdot H_3(Z) \tag{22}$$

$H_4(Z)$ of the formula (20) is modified as follows.

$$H_4(Z) = \frac{X \cdot \frac{Td/\Delta}{1 + X + Td/\Delta}(1 - Z^{-1})}{1 - \frac{Td/\Delta}{1 + X + Td/\Delta} \cdot Z^{-1}} \tag{23}$$

Thus, the non-linear signal processing apparatus of FIG. 5 in accordance with the present embodiment operates in accordance with $H(Z)$ of the formula (22) so that it presents the non-linear emphasis characteristic. In FIG. 5, the first signal processing circuit 13 has the high frequency emphasis characteristic represented by $H_1(Z)$ of the formula (19) and the second signal processing circuit 15 has the high-pass filter characteristic represented by $H_3(Z)$ of the formula (21). The non-linear signal processing circuit 14 has the characteristic represented by $H_4(Z)$ of the formula (23). In FIG. 4 which shows the configuration of the non-linear signal processing circuit 14, the delay times of the delay circuits 20 and 23 each is equal to one sampling period $\Delta$, as seen from $H_4(Z)$. That is, the integer n is equal to one. The multiplication factor K of the multiplier circuit 25 is equal to X. The multiplication factor F of the non-linear circuit 22 for non-linearly compressing the signal is represented by $$F = \frac{Td/\Delta}{1 + X + Td/\Delta} \tag{24}$$

Figure 9:
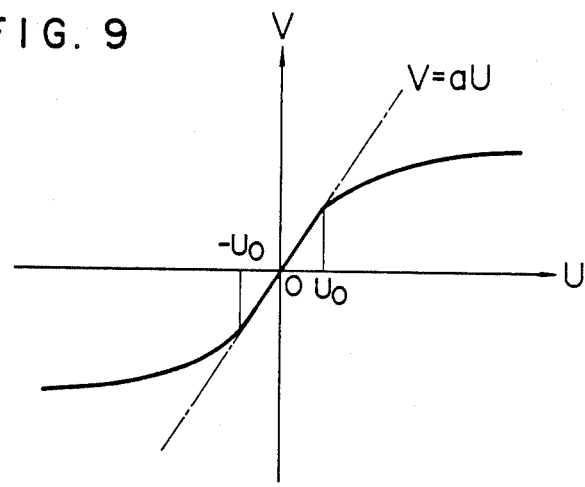
FIG. 9 shows the input/output relationship of the non-linear circuit for the non-linear signal processing apparatus of the present invention.

Since Td on the right side of the formula (24) is proportional to the internal resistance Rd of the anti-parallel connection of the diodes 5 and 6 (FIG. 1) as seen from the formula (4), it non-linearly varies with the amplitude of the signal. Accordingly, F in the formula (24) is also a non-linear coefficient and the input/output characteristic of the non-linear circuit 22 is determined by F. The input/output characteristic is shown in FIG. 9, which the abscissa U represents the input signal to the non-linear circuit 22 and the ordinate V represents the output signal. The input/output characteristic is explained below.

Since Rd represents the internal resistance of the anti-parallel connection of the diodes, it is determined by the voltage-current characteristic of the diodes. The voltage-current characteristic of the diodes is such that little current flows when the voltage across the diode is small, and the current suddenly increases as the voltage exceeds a potential knee. The input/output characteristic of the non-linear circuit 22 is considered with reference to FIG. 9. Assuming that if the amplitude of the input U is smaller than $U_o$, the voltage across the diode is small and no current flows through the diode. In this range, Rd is infinite. Thus, Td is also infinite as seen from the formula (4) and F is constant (1) as seen from the formula (24). Thus, when the input U is in the range of $-U_o < U < U_o$, the output V and the input U have a linear relation (shown by a chain line in FIG. 9) and the gradient a (FIG. 9) is equal to unity (1). The input/output relationship of the non-linear circuit 22 when the amplitude of the input U exceeds $U_o$ and a relatively large amplitude is now explained. As the voltage across the diode increases, the current starts to flow and the internal resistance Rd and Td decrease. Thus, F becomes smaller than 1 as seen from the formula (24) and the input/output characteristic curve (solid line) shown in FIG. 9 deviates from the line V=aU as U exceeds $U_o$ and the amplitude of the output V is non-linearly compressed. However, although the diode conducts as the voltage across the diode exceeds the potential knee, the internal resistance Rd does not become zero. Accordingly, the amplitude of the output for the higher amplitude input is not smaller than the amplitude of the output for the smaller amplitude input, and the output amplitude monotonically changes with the input amplitude as shown in FIG. 9.

In order to achieve the above input/output characteristic by the digital signal processing technique, the characteristic may be linearly approximated by switching and adder/subtractor circuits (shown by the broken line in FIG. 9), or the characteristic may be stored in a read-only memory (ROM). In the latter case, waveform distortions at the switching points are eliminated.

In the present embodiment, the first signal processing circuit 13 which presents the emphasis characteristic, the non-linear signal processing circuit 14 which non-linearly compresses the time variation of the signal and the second signal processing circuit 15 which presents the high-pass filter characteristic are provided so that the non-linear emphasis characteristic for non-linearly changing the degree of emphasis in accordance with the signal level of the input signal is attained by the digital signal processing technique which is superior to the analog signal processing technique in terms of integrity and safety.

A second embodiment of the non-linear signal processing apparatus of the present invention is now explained. The present embodiment presents a non-linear emphasis characteristic as the first embodiment does. The configuration of the present embodiment is identical to the configuration of the first embodiment shown in FIG. 5 and the configuration of the non-linear circuit 14 shown in FIG. 4 except that the second signal processing circuit 15 supplies the signal inputted thereto to the arithmetic operation circuit 16 (or adder circuit 27) as it is and the input/output characteristic of the nonlinear circuit 22 is slightly different from that of the first embodiment. The operation of the present embodiment is explained with reference to a circuit model and a transfer function.

In the circuit model shown in FIG. 8 for the first embodiment, the transfer function of the circuit model 48 is represented by $H_4(S)$ in the formula (17) and the transfer function of the circuit model 32 is represented by $H_3(S)$ of the formula (14). Those $H_4(S)$ and $H_3(S)$ are high-pass filter characteristics. $H_5(S)$ is defined as follows.

$$H_5(S) = H_4(S) \cdot H_3(S) \tag{25}$$

It is also a high-pass filter characteristic. $H_5(S)$ is represented by $H_4(S)$ and $H_3(S)$ of the formulas (17) and (14) as follows.

$$H_5(S) = \frac{XTTdS^2}{(1+X)+\{(1+X)T+Td\}S+TTdS^2} \tag{26}$$

In $H_5(S)$, the circuit simplification is made. It is an usual way to put $S=j\omega$ (where $\omega$ is an angular frequency) in order to determine a gain characteristic and a phase characteristic in a frequency region of the circuit. It may be considered that $S$ is large for a high frequency component and small for a low frequency component. Since $H_5(S)$ in the formula (26) has the high-pass filter characteristic, the simplification by a circuit which approximates a response in the high frequency band is considered. The denominator of the fraction on the right side of the formula (26) is a second-order function of $S$. If $S$ is sufficiently large in the second-order function, a 0-order term of $S$, that is, a constant term may be approximately eliminated. The transfer function $H_6(S)$ thus approximated is represented by $$H_5(S) \approx H_6(S) = \frac{XTTdS}{(1+X)T+Td+TTdS} \tag{27}$$

It is seen from the above formula that $H_6(S)$ also has a high-pass filter characteristic.

By the above approximation by the transfer function, the circuit model (FIG. 8) of the first embodiment is modified as shown in FIG. 10. A circuit model 49 and a circuit model 50 in FIG. 10 are different from those of FIG. 8, and in a circuit model 49, a resistor 51 is inserted in parallel to the potentiometer 40. The resistance thereof is represented by $R_1+R_2$. A transfer function $H_7(S)$ of a circuit model 50 is represented by $$H_7(S) = 1 \tag{28}$$

because the circuit models 48 and 32 of FIG. 8 are approximated by the circuit model 49 of FIG. 10 in accordance with the formula (27).

The non-linear emphasis circuit model of FIG. 10 is S-Z transformed to the discrete time system with the differential method as was done in the first embodiment.

Since the characteristic $H_1(S)$ of the circuit model 30 of FIG. 10 is equal to that of the circuit model 30 of FIG. 8, the Z-transform function is equal to $H_1(Z)$ of the formula (19). Since the characteristic of the circuit model 50 of FIG. 10 is 1 as shown by the formula (28), the Z-transform function $H_7(Z)$ is represented by $$H_7(Z) = 1 \tag{29}$$

The characteristic $H_6(S)$ of the circuit model 49 is S-Z transformed in accordance with the formula (18) to obtain $$H_6(Z) = \frac{X \cdot \frac{TTd}{\Delta}(1-Z^{-1})}{(1+X)T+Td+\frac{TTd}{\Delta}(1-Z^{-1})} \tag{30}$$

$H_6(Z)$ is modified as follows.

$$H_6(Z) = \frac{X\frac{TTd/\Delta}{(1+X)T+Td+TTd/\Delta}(1-Z^{-1})}{1-\frac{TTd/\Delta}{(1+X)T+Td+TTd/\Delta}Z^{-1}} \tag{31}$$

The characteristic $H(Z)$ of the non-linear signal processing apparatus of the present embodiment is represented by $$H(Z) = 1 + H_1(Z) \cdot H_6(Z) \cdot H_7(Z) \tag{32}$$

Thus, it presents the non-linear emphasis characteristic. The first signal processing circuit 13 of FIG. 5 has the same high frequency emphasis characteristic as the first embodiment but the second signal processing circuit 15 outputs the input signal as it is as shown by $H_7(Z)$ of the formula (29). The non-linear signal processing circuit 14 is identical to that of the first embodiment in that it is represented by $H_6(Z)$ of the formula (31), the delay times of the delay circuits 20 and 24 of FIG. 4 each is equal to $\Delta$ and the multiplication factor K of the multiplier circuit 25 of FIG. 4 is equal to X. The multiplier F for the non-linear circuit 22 for non-linearly compressing the signal is represented, from the formula (31), as follows.

$$F = \frac{TTd/\Delta}{(1+X)T+Td+TTd/\Delta} \tag{33}$$

As explained in connection with the input/output relationship of the non-linear circuit 22 of the first embodiment, the multiple F is constant at $T/\Delta/(1+T/\Delta)$ when the signal level is low because Td is infinite, and F decreases as the signal level increases. Accordingly, the input/output relationship has a gradient a of $T/\Delta/(1+T/\Delta)$ in a low signal range of the input U in FIG. 9.

In the present embodiment, the first signal processing circuit 13 which presents the emphasis characteristic, the non-linear signal processing circuit 14 which non-linerly compresses the time variation of the signal, and the second signal processing circuit 15 which outputs the input signal as it is are provided so that the non-linear emphasis characteristic which non-linearly varies the emphasis in accordance with the signal level of the input signal can be attained by the digital signal processing technique. The circuit scale of the second signal processing circuit 15 is smaller than that of the first embodiment.

A third embodiment of the present invention is now explained. The configuration of the present embodiment is represented by the block diagram of FIG. 5 which represents the first and second embodiment. The third embodiment differs from the first embodiment in that the first signal processing circuit 13 of FIG. 5 has a high-pass filter characteristic. The present embodiment is explained with reference to the circuit model.

In the first embodiment, the parallel connection of the capacitor 37 and the resistor 38 of the circuit model 31 of FIG. 7 is approximated by the capacitor which does not pass the low frequency component in order to simplify the circuit to the circuit model 48 of FIG. 8. In a similar manner, the parallel connection of the capacitor 33 and the resistor 34 of the circuit model 30 of FIG. 8 is approximated by a capacitor which does not pass the low frequency component, since the circuit model 45 having the high-pass filter characteristic is inserted after the parallel connection so that the circuit model 30 of FIG. 8 is modified to a circuit model 52 shown in the non-linear emphasis circuit model of FIG. 11. The angular frequency for determining the capacitance of the approximating capacitor in the circuit model 52 may be a resonance angular frequency of the parallel connection of the capacitor 33 and the resistor 34 in FIG. 8, but in the present embodiment, an infinite angular frequency is selected and the resistor 34 is removed as was done in the first embodiment.

A transfer function $H_8(S)$ of the circuit model 52 of FIG. 11 which approximates the circuit model 30 of FIG. 8 is represented as follows.

$$H_8(S) = \frac{Ts}{X + Ts} \tag{34}$$

$H_8(S)$ is S-Z transformed by the differential method in accordance with the formula (18) to obtain.

$$H_8(S) = \frac{\frac{T}{\Delta}(1 - Z^{-1})}{X + \frac{T}{\Delta}(1 - Z^{-1})} \tag{35}$$

As seen from the above formula, $H_8(Z)$ has a high-pass filter characteristic which passes only the high frequency component of the signal.

Thus, the configuration of the non-linear signal processing apparatus of the present embodiment is represented by FIG. 5, the first signal processing circuit 13 of FIG. 5 has the high-pass filter characteristic represented by $H_8(Z)$ of the formula (35), and the non-linear signal processing circuit 14 and the second signal processing circuit 15 have the characteristics represented by $H_4(Z)$ of the formula (23) and $H_3(Z)$ of the formula (21), as was done in the first embodiment. Accordingly, the characteristic $H(Z)$ of the present embodiment is represented by $$H(Z) = 1 + H_8(Z) \cdot H_4(Z) \cdot H_3(Z) \tag{36}$$

which presents the non-linear emphasis characteristic.

In the present embodiment, the first signal processing circuit 13 which passes the high frequency component of the signal, the non-linear signal processing circuit 14 which non-linearly compresses the time variation of the signal and the second signal processing circuit 15 having the high-pass filter characteristic are provided so that the non-linear emphasis characteristic which non-linearly varies the emphasis in accordance with the signal level of the input signal is attained by the digital signal processing technique. Since the characteristic of the first signal processing circuit 13 is not the emphasis characteristic which passes the D.C. component plus the high frequency component but the high-pass filter characteristic which passes only the high frequency component, the dynamic range of the output signal may be smaller and the circuit scale may be smaller than those of the first embodiment.

A fourth embodiment of the present invention is now explained. The configuration of the present embodiment is similar to FIG. 5 which represents the configuration of the first embodiment except that the first signal processing circuit 13 has the high-pass frequency characteristic and the second signal processing circuit 15 outputs the input signal as it is. The present embodiment is explained with reference to the circuit model.

In the third embodiment, the circuit model 30 of FIG. 8 is simplified to the circuit model 52 of FIG. 11. In the second embodiment, the circuit models 48 and 32 of FIG. 8 are simplified to the circuit models 49 and 50 of FIG. 10. The circuits shown in FIGS. 11 and 10 each functions as the non-linear emphasis circuit. As shown in FIG. 12, a circuit comprising the circuit models 52, 49 and 50 also functions as a non-linear emphasis circuit. A characteristic $H(S)$ thereof is represented by $H_8(S)$ of the formula (34), $H_6(S)$ of the formula (27) and $H_7(S)$ of the formula (28) as follows.

$$H(S) = 1 + H_8(S) \cdot H_6(S) \cdot H_7(S) \tag{37}$$

$H(S)$ is S-Z transformed in accordace with the formula (18) to obtain a characteristic $H(Z)$ which is represented by $H_8(Z)$ of the formula (35), $H_6(Z)$ of the formula (31) and $H_7(Z)$ of the formula (29) as follows.

$$H(Z) = 1 + H_8(Z) \cdot H_6(Z) \cdot H_7(Z) \tag{38}$$

$H(Z)$ of the formula (38) also presents the non-linear emphasis characteristic. In the present embodiment, since the first signal processing circuit 13 has the high-pass filter characteristic, the output dynamic range may be smaller than that of the second embodiment, and the circuit scale is reduced because the second signal processing circuit 15 outputs the input signal as it is.

A fifth embodiment of the non-linear signal processing apparatus of the present invention is now explained. The configuration of the present embodiment is similar to that of FIG. 5. The present embodiment presents a non-linear emphasis characteristic as the first, second, third and fourth embodiments do. In the present embodiment, the first signal processing circuit 13 of FIG. 5 outputs the input signal as it is, and the non-linear circuit 22 has slightly different input/output characteristic than that of the first or third embodiment. Otherwise, it is same as the first or third embodiment.

The operation of the present embodiment is explained by the circuit model and the transfer function.

In the circuit model of FIG. 11 used to explain the third embodiment, the transfer function of the circuit model 52 is represented by $H_8(S)$ of the formula (34) and the transfer function of the circuit model 48 is represented by $H_4(S)$ of the formula (17). Those $H_8(S)$ and $H_4(S)$ have the high-pass filter characteristics. The combined $H_8(S)$ and $H_4(S)$ is simplified by the method used in the second embodiment (see the formulas (25), (26), (27)). $H_9(S)$ is defined as follows.

$$H_9(S) = H_8(S) \cdot H_4(S) \tag{39}$$

$$= \frac{X \cdot TT_d S^2}{X(1 + X) + \{(1 + X)T + XT_d\}S + TT_d S^2}$$

$H_9(S)$ also presents a high-pass filter characteristic. The second-order formula of S in the denominator of the fraction on the right side of the formula (39) is approximated by a linear formula. Assuming that S is sufficiently large for a response in the high frequency band, the constant term of the second-order formula is erased. $H_{10}(S)$ which approximates $H_9(S)$ is represented by $$H_9(S) \approx H_{10}(S) = \frac{XTTdS}{(1 + X)T + XTd + TTdS} \quad (40)$$

It is seen from the above formula that $H_{10}(S)$ also presents the high-pass filter characteristic.

Figure 13:
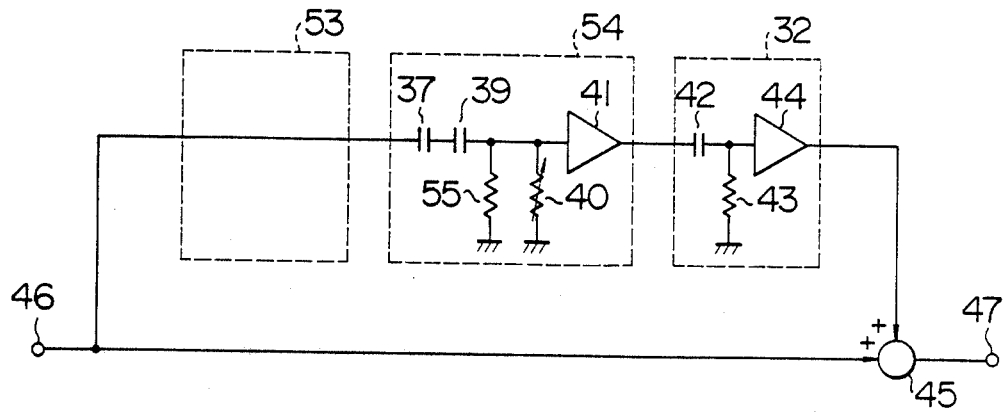
FIG. 13 shows a circuit model for illustrating the operation of a fifth embodiment of the present invention.

By the above approximation of the transfer function, the circuit model of the present embodiment is constructed as shown in FIG. 13. The present circuit model differes from the circuit model of FIG. 11 in the circuit modes 53 and 54. The circuit model 53 outputs the input signal as it is. A transfer function $H_{11}(S)$ is represented as follows.

$$H_{11}(S) = 1 \quad (41)$$

The circuit model 54 has a characteristic represented by $H_{10}(S)$ of the formula (40) and comprises a resistor 55 (having a resistance of $(R_1+R_2)\cdot R_2/R_1$) connected in parallel to the potentiometer 40 of the circuit model 48 in FIG. 11.

The non-linear emphasis circuit model of FIG. 13 is S-Z transformed to the discrete time system by the differential method of the formula (18).

A transfer function $H_{11}(Z)$ of the circuit model 53 by the Z-transform formula is represented, from the formula (41), as follows.

$$H_{11}(Z) = 1 \quad (42)$$

A transfer function $H_{10}(Z)$ of the circuit model 54 is represented, from the formula (40), as follows.

$$H_{10}(Z) = \frac{X \cdot \frac{TTd}{\Delta}(1 - Z^{-1})}{(1 + X)T + XTd + \frac{TTd}{\Delta}(1 - Z^{-1})} \quad (43)$$

$$= \frac{X \cdot \frac{TTd/\Delta}{(1 + X)T + XTd + TTd/\Delta}(1 - Z^{-1})}{1 - \frac{TTd/\Delta}{(1 + X)T + XTd + TTd/\Delta} Z^{-1}} \quad (43)$$

A transfer function of the circuit model 32 is represented by $H_3(Z)$ of the formula (21).

Thus, the non-linear signal processing apparatus of the present embodiment presents a characteristic of $$H(Z) = 1 + H_{11}(Z) \cdot H_{10}(Z) \cdot H_3(Z) \quad (44)$$

which presents the non-linear emphasis characteristic.

In the present embodiment, since the non-linear signal processing circuit 14 has the transfer function $H_{10}(Z)$ of the formula (43), the delay times of the delay circuits 20 and 23 in FIG. 4 each is equal to $\Delta$, and the multiplier K of the multiplier circuit 25 is equal to X. However, the multiplier F for the non-linear circuit 22 to non-linearly compress the signal is represented, from the formula (43), as follows.

$$F = \frac{TTd/\Delta}{(1 + X)T + XTd + TTd/\Delta} \quad (45)$$

when the signal level of the input signal to the non-linear circuit 22 is low, Td is infinite and F is constant at $T/\Delta/(X+T/\Delta)$ as seen from the formula (45), and the input/output relationship in the non-linear circuit 22 is linear with a gradient $T/\Delta/(X+T/\Delta)$. As the signal level increases, Td decreases, F decreases and the signal is compressed. The input/output relationship has a characteristic which is similar to that of FIG. 9 in a small input signal level range with the gradient a of $T/\Delta/(X+T/\Delta)$.

In the present embodiment, the first signal processing circuit 13 which outputs the input signal as it is, the non-linear signal processing circuit 14 which non-linearly compresses the time variation of the signal and the second signal processing circuit 15 which has the high-pass filter characteristics are provided so that the non-linear emphasis characteristic which non-linearly varies the emphasis in accordance with the signal level of the input signal is attained by the digital signal processing technique. Since the characteristic of the first signal processing circuit 13 is not the emphasis characteristic nor the high-pass filter characteristic but it outputs the input signal as it is, the circuit scale is smaller than that of the first or third embodiment.

A sixth embodiment of the non-linear signal processing apparatus of the present invention is now explained. The configuration of the present embodiment is same as that shown in FIG. 5 and presents a non-linear emphasis characteristic. The first signal processing circuit 13 and the second signal processing circuit 15 of FIG. 5 each has a characteristic to output the input signal as it is. The operation is explained below.

In the circuit model of FIG. 13 used to explain the fifth embodiment, the circuit models 54 and 32 present the high-pass filter characteristics, and they are simplified as was done in the fifth embodiment. A transfer function of the circuit model 54 is represented by $H_{10}(S)$ of the formula (40) and a transfer function of the circuit model 32 is represented by $H_3(S)$ of the formula (14). $H_{12}(S)$ is defined as follows.

$$H_{12}(S) = H_{10}(S) \cdot H_3(S) \quad (46)$$

$$= \frac{XTTds \cdot Ts}{\{(1 + X)T + XTd + TTdS\}(1 + Ts)}$$

$$= \frac{XT^2TdS^2}{(1 + X)T + Td + (1 + X)(T + Td)Ts + T^2TdS}$$

Since $H_{12}(S)$ also presents the high-pass filter characteristic, a constant term relating to S in the denominator of the right side is erased. The approximated transfer function $H_{13}(S)$ is represented as follows.

$$H_{12}(S) \approx H_{13}(S) = \frac{X \cdot TTdS}{(1 + X)(T + Td) + TTds} \quad (47)$$

It is seen from the formula (47) that $H_{13}(S)$ also presents the high-pass filter characteristic.

Figure 14:
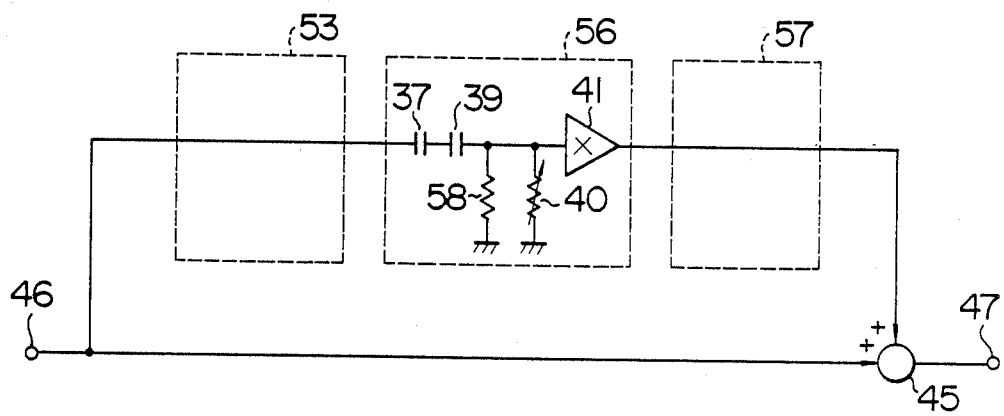
FIG. 14 shows a circuit model for illustrating the operation of a sixth embodiment of the present invention.

By the above approximation of the transfer function, the circuit model of the present embodiment is configured as shown in FIG. 14. The present circuit model differes from the circuit model of FIG. 13 in the circuit models 56 and 57. The circuit model 57 outputs the input signal as it is and a transfer function $H_{14}(S)$ thereof is given by $$H_{14}(S) = 1 \quad (48)$$

The circuit model 56 has the characteristic represented by $H_{13}(S)$ of the formula (47) and a resistor 58 having a resistance $R_2$ is substituted for the resistor 55 of the circuit model 54 of FIG. 13. Those $H_{13}(S)$ and $H_{14}(S)$ are S-Z transformed in accordance with the formula (18) to obtain $$H_{13}(Z) = \frac{X \cdot \frac{TTd}{\Delta}(1 - Z^{-1})}{(1 + X)(T + Td) + \frac{TTd}{\Delta}(1 - Z^{-1})} \quad (49)$$

$$= \frac{X \cdot \frac{TTd/\Delta}{(1 + X)(T + Td) + TTd/\Delta}(1 - Z^{-1})}{1 - \frac{TTd/\Delta}{(1 + X)(T + Td) + TTd/\Delta} Z^{-1}}$$

$$H_{14}(Z) = 1 \quad (50)$$

The circuit model 53 outputs the input signal as it is as it does in the fifth embodiment and the transfer function thereof is represented by $H_{11}(Z)$ of the formula (42). Thus, the non-linear signal processing apparatus of the present embodiment has a transfer function $H(Z)$ represented by $$H(Z) = 1 + H_{11}(Z) \cdot H_{13}(Z) \cdot H_{14}(Z) \quad (51)$$

$$= 1 + \frac{X \cdot \frac{TTd/\Delta}{(1 + X)(T + Td) + TTd/\Delta}(1 - Z^{-1})}{1 - \frac{TTd/\Delta}{(1 + X)(T + Td) + TTd/\Delta} Z^{-1}}$$

which presents the non-linear emphasis characteristic.

In the non-linear signal processing circuit 14 (FIG. 5) of the present embodiment, the delay times of the delay circuits 20 and 23 each is equal to $\Delta$, the multiplier K of the multiplier circuit 25 is equal to X, and the multiplier F for the non-linear circuit 22 to non-linearly compress the signal is given, from the formula (49), by $$F = \frac{TTd/\Delta}{(1 + X)(T + Td) + TTd/\Delta} \quad (52)$$

Since Td is infinite when the signal level of the input signal to the non-linear circuit 22 is low, F is constant at $T/\Delta/(1+X+T/\Delta)$ as seen from the formula (52). Thus the input/output relationship is linear with a gradiend of $T/\Delta/(1+X+T/\Delta)$ as the signal level of the input signal to the non-linear circuit 22 increases, Td decreases and F decreases so that the signal is compressed. The input/output relationship of the non-linear circuit 22 is equivalent to that of FIG. 9 in a small input signal range with the gradient a of $T/\Delta/(1+X+T/\Delta)$.

In the present embodiment, the first signal processing circuit 13 which outputs the input signal as it is, the second signal processing circuit 15 which outputs the input signals as it is, and the non-linear signal processing circuit 14 which non-linearly compresses the time variation of the signal are provided so that the non-linear emphasis characteristic which non-linearly varies the emphasis in accordance with the signal level of the input signal is attained by the digital signal processing technique. Since the characteristics of the first and second signal processing circuits 13 and 15 are not emphasis characteristics nor the high-pass filter characteristics but they output the input signals as they are, the circuit scale is reduced substantially.

Figure 15:
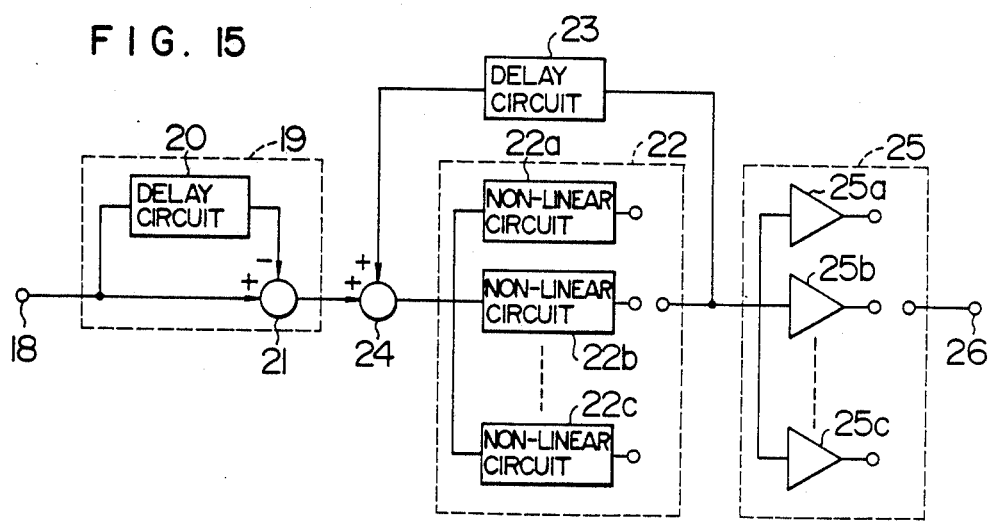
FIG. 15 is a block diagram of one embodiment of the non-linear signal processing circuit for the non-linear signal processing apparatus of the present invention.

A seventh embodiment of the present invention is now explained. The configuration of the present embodiment is similar to that of FIG. 5 and presents the non-linear emphasis characteristic. The non-linear signal processing circuit 14 of FIG. 5 is configured as shown in FIG. 15. The non-linear signal processing circuit 14 of FIG. 15 is similar to that of FIG. 4 except that the non-linear circuit 22 can select one of two or more non-linear circuits 22a–22c and the multiplier circuit 25 can select one of two or more multiplier circuits 25a–25c. The operation is explained below.

The transfer function H(Z) of the sixth embodiment is shown by the formula (51). The non-linear multiplier F of the non-linear circuit 22 is given by the formula (52) and the multiplier K of the multiplier circuit 25 is equal to X. The transfer equation H(Z) of the configuration of FIG. 4 is expressed by F and K as follows.

$$H(Z) = 1 + \frac{KF(1 - Z^{-1})}{1 - FZ^{-1}} \quad (55)$$

The non-linear emphasis characteristic is determined by the capacitance of the capacitor, the resistance of the resistor and the diode characteristic, as explained by the prior art circuit model of FIG. 1. Those values are represented by X, T, Td in the formulas (2), (3) and (4). In the formula (55), only K and F change with X, T, Td and the configuration itself does not change. Accordingly, if two or more non-linear emphasis characteristics are required, the non-linear multiplier F of the non-linear circuit 22 and the multiplier K of the multiplier circuit 25 are changed and the configuration of the apparatus need not be changed. When the signal processing apparatus is implemented by an IC in a VTR, and the non-linear emphasis characteristic and the sampling period need to be changed because of a change of the video signal system, for example, from the NTSC system to the PAL system, the same configuration and the same IC may be used.

Several embodiments of the non-linear signal processing apparatus which presents the non-linear emphasis characteristic have been explained. The sixth embodiment is most effective from the standpoint of circuit scale. The transfer dunction H(Z) (formula (51)) of the sixth embodiment may be derived from the transfer function H(S) (formula (6)) in the prior art non-linear emphasis circuit model of FIG. 1. H(S) of the formula (6) is modified to $$H(S) = 1 + \frac{XTTdS^2}{(1 + X) + (1 + X)(T + Td)S + TTdS^2} \quad (53)$$

The constant term in the second-order formula of S in the denominator of the second term of the right side of the formula (53) is erased to obtain $$H(S) = 1 + \frac{XTTdS}{(1 + X)(T + Td) + TTdS} \quad (54)$$

This H(S) is identical to the transfer function of the circuit model of the sixth embodiment. The sixth embodiment is smallest in the circuit scale and effectively approximates the original non-linear emphasis characteristic.

Various embodiments having the non-linear emphasis characteristics have been described. A non-linear signal processing apparatus having a non-linear deemphasis characteristic which is a reverse characteristic to the non-linear emphasis characteristic is now described.

Figure 16:
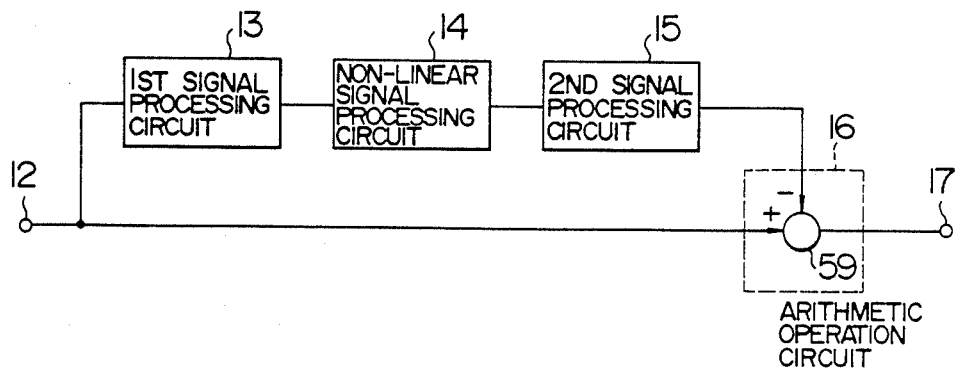
FIG. 16 is a block diagram of a non-linear signal processing apparatus having a non-linear deemphasis charactesistic in accordance with another embodiment of the present invention.

FIG. 16 is a block diagram of an eighth embodiment of the non-linear signal processing apparatus of the present invention. The present embodiment differs from the configuration of FIG. 5 in that the signal applied to the input terminal 12 is a non-linearly emphasized video signal, the output signal from the output terminal 17 is a non-linearly deemphasized version of the signal applied to the input terminal 12, and the arithmetic operation circuit 16 has a subtraction function to subtract the output signal of the second signal processing circuit 15 from the signal applied to the input terminal 12. (The arithmetic operation circuit may be considered as a subtraction circuit 59). The non-linear signal processing circuit 14 is similar to the configuration of FIG. 4. In order to make a distinction from the non-linear emphasis, the multiplier for the non-linear circuit 22 of FIG. 4 to non-linearly compress the signal is represented by F' and the multiplier of the multiplier circuit 25 is represented by K'. The operation is explained below.

The transfer function which represents the prior art non-linear emphasis characteristic is shown in the formula (6). In order to deemphasize the signal which was non-linearly emphasized by H(S) of the formula (6), a characteristic of 1/H(S) is required. This non-linear deemphasis characteristic G(S) is given, from the formula (6), by $$G(S) = 1/H(S)$$

$$= 1 - \frac{X \cdot TdS \cdot TS}{(1 + X)(1 + TdS)(1 + Ts)} \quad (56)$$

$G_1(S)$ and $G_2(S)$ are defined as follows.

$$G_1(S) = \frac{\frac{X}{1 + X} \cdot TdS}{1 + TdS} \quad (57)$$

$$G_2(S) = \frac{TS}{1 + Ts} \quad (58)$$

Those $G_1(S)$ and $G_2(S)$ are S-Z transformed in accordance with the formula (18) to obtain $$G_1(Z) = \frac{\frac{X}{1 + X} \cdot \frac{Td/\Delta}{1 + Td/\Delta} (1 - Z^{-1})}{1 - \frac{Td/\Delta}{1 + Td/\Delta} Z^{-1}} \quad (59)$$

$$G_2(Z) = \frac{T/\Delta(1 - Z^{-1})}{1 + T/\Delta(1 - Z^{-1})} \quad (60)$$

A transfer function $G_3(Z)$ has a function to output the input signal as it is. Thus, $$G_3(Z) = 1 \quad (61)$$

The transfer function G(S) which presents the non-linear deemphasis characteristic of the formula (56) is S-Z transformed to obtain G(Z), which is represented, from the formulas (59)–(61), as follows.

$$G(Z) = 1 - G_3(Z) \cdot G_1(Z) \cdot G_2(Z) \quad (62)$$

In FIG. 16, the first signal processing circuit 13 is represented by $G_3(Z)$ which outputs the input sigal as it is, the non-linear signal processing circuit 14 is represented by $G_1(Z)$ and the second signal processing circuit 15 is represented by $G_2(Z)$ which presents the high-pass filter characteristic. In the non-linear signal processing circuit 14, the delay circuits 20 and 23 in FIG. 4 each delays the signal by the time period $\Delta$, the multiplier K' of the multiplier circuit 25 is X/(1+X) as seen from the formula (59), and the multiplier F' for the non-linear circuit 22 to non-linearly compress the signal is given by $$F' = \frac{\frac{Td}{\Delta}}{1 + \frac{Td}{\Delta}} \quad (63)$$

Since Td is infinite when the signal level of the input signal to the non-linear circuit 22 is low, F is constant at 1 as seen from the formula (63). Thus, the input/output relationship is linear with a gradient of 1. As the signal level of the input signal to the non-linear circuit 22 is increases, Td decreases and F decreases so that the signal is compressed. The input/output relationship of the non-linear circuit 22 is equivalent to that of FIG. 9 in the small input signal range with the gradient a of 1.

In the present embodiment, the first signal processing circuit 13 which outputs the input signal as it is, the non-linear circuit 14 which non-linearly compresses the time variation of the signal, the second signal processing circuit 15 which has the high-pass filter characteristic, and the arithmetic operation circuit 16 which has the subtraction function are provided so that the non-linear deemphasis characteristic for deemphasizing the non-linearly emphasized signal is easily attained by the digital signal processing technique.

A ninth embodiment of the present invention is now explained. The configuration of the present embodiment is similar to that of the eighth embodiment of FIG. 16 and presents the non-linear deemphasis characteristic. It differs from the eighth embodiment in that the second signal processing circuit 15 of FIG. 16 outputs the input signal as it is, and the input/output relationship of the non-linear circuit 22 of the non-linear signal processing circuit 14 of FIG. 4 is somewhat different. The operation is explained below.

The transfer function G(S) of the formula (56) which represents the non-linear deemphasis characteristic is modified to $$G(S) = 1 - \frac{\frac{X}{1 + X} \cdot T \cdot TdS^2}{1 + (T + Td)S + TTdS^2} \quad (64)$$

Since the second term in the right side of the formula (64) presents the high-pass filter characteristic which does not pass the low frequency component, the constant term of the second-order formula of S in the denominator of the second term of the right side is erased to simplify the circuit. The second term of the right side with the constant term being erased is represented by $G_4(S)$ as follows.

$$G_4(S) = \frac{\frac{X}{1 + X} \cdot TTdS}{T + Td + TTdS} \quad (65)$$

This $G_4(S)$ also presents the high-pass filter characteristic. $G_4(S)$ is S-Z transformed in accordance with the formula (18) to obtain $$G_4(Z) = \frac{\frac{X}{1 + X} \cdot \frac{TTd/\Delta}{T + Td + TTd/\Delta} (1 - Z^{-1})}{1 - \frac{TTd/\Delta}{T + Td + TTd/\Delta} Z^{-1}} \quad (66)$$

This $G_4(Z)$ can be attained by the non-linear signal processing circuit 14 of FIG. 16. The multiplier F' for the non-linear circuit 22 of FIG. 4 to non-linearly compress the signal, and the multiplier K' of the multiplier circuit 25 are given by $$F = \frac{TTd/\Delta}{T + Td + TTd/\Delta} \quad (67)$$

$$K' = \frac{X}{1 + X} \quad (68)$$

When the signal level of the input signal to the non-linear circuit 22 is low, Td is infinite and F' is constant at $T/\Delta/(1+T/\Delta)$. As the signal level of the input signal to the non-linear circuit 22 increases, Td decreases and F' decreases so that the signal is compressed. The input/output relationship is equivalent to that of FIG. 9 in the small input signal range with the gradient a of $T/\Delta/(1+T/\Delta)$.

In the second signal processing circuit 15, the second term of the right side of the formula (64) is simplified to $G_4(S)$ of the formula (65) so that it outputs the input signal as it is. Thus, the transfer function $G_5(Z)$ is given by $$G_5(Z) = 1 \quad (69)$$

The first signal processing circuit 13 has the transfer function $G_3(Z)$ of the formula (61) as it does in the eighth embodiment, and outputs the input signal as it is. The transfer function G(Z) of the present embodiment is given by $$G(Z) = 1 - G_3(Z) \cdot G_4(Z) \cdot G_5(Z) \quad (70)$$

In the present embodiment, the first signal processing circuit 13 which outputs the input signal as it is, the second signal processing circuit 15 which outputs the input signal as it is, the non-linear circuit 14 which non-linearly compresses the time variation of the signal, and the arithmetic operation circuit 16 having the subtraction function are provided so that the non-linear deemphasis characteristic which deemphasizes the non-linearly emphasized signal is easily attained by the digital signal processing technique. Since the second signal processing circuit 15 outputs the input signal as it is, the circuit scale is smaller than that of the eighth embodiment.

A 10th embodiment of the present embodiment is now explained. The configuration of the present embodiment is similar to that of FIG. 16 and it presents the non-linear deemphasis characteristic. The first signal processing circuit 13 and the second signal processing circuit 15 is FIG. 16 each outputs the input signal as it is. The non-linear signal processing circuit 14 is configured as shown in FIG. 15 as is done in the seventh embodiment. The operation is explained below.

The transfer function G(Z) of the ninth embodiment is shown in the formula (70). G(Z) is represented by the multiplier F' of the non-linear circuit 22 of FIG. 4 and the multiplier K' of the multiplier circuit 25, as follows.

$$G(Z) = 1 - \frac{K'F'(1 - Z^{-1})}{1 - FZ^{-1}} \quad (71)$$

As described in the seventh embodiment, the non-linear deemphasis characteristic of the present embodiment is determined only by F' and K' of the formula (71) and the configuration does not change. Accordingly, F' and K' may be selected from two or more alternatives without changing the configuration.

Figure 17:
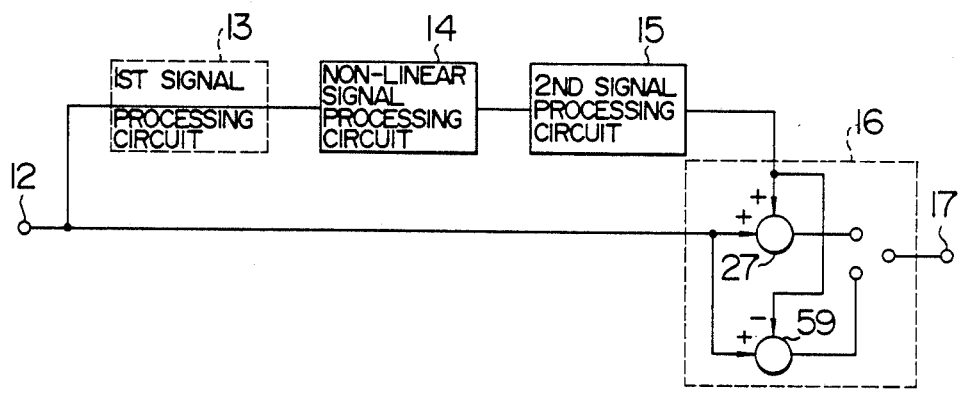
FIG. 17 shows a block diagram of a non-linear signal processing apparatus in accordance with 11th and 12th embodiments of the present invention.

An 11th embodiment of the present invention is now described. The configuration of the present embodiment is shown in FIG. 17. The configuration of FIG. 17 is similar to that of FIG. 3. A digital video signal or a non-linearly emphasized version thereof is applied to the input terminal 12. The first signal processing circuit 13 outputs the input signal as it is, the signal processing circuit 14 is non-linear is configured as shown in FIG. 15, the second signal processing circuit 15 has the high-pass filter characteristic, and the arithmetic operation circuit 16 includes an adder circuit 27 having an add function and a subtractor circuit 59 having a subtract function and has a function to select one of those two functions to produce an output of the arithmetic operation circuit 16 at an output terminal 17. In the non-linear signal processing apparatus of the present embodiment, the multipliers F and F' of the non-linear circuit 22 (FIG. 15) of the non-linear signal processing circuit 14, the multipliers K and K' of the multiplier circuit 22, and the add function and the subtract function of the arithmetic operation circuit 16 are selectively used to present the non-linear emphasis characteristic and the non-linear deemphasis characteristic. The operation is explained below.

The fifth embodiment of the present invention has the non-linear emphasis characteristic, the transfer function thereof is represented by H(Z) of the formula (44), $H_{11}(Z)$ of the formula (44) is represented by the formula (42), $H_{10}(Z)$ is represented by the formula (40), and $H_3(Z)$ is represented by the formula (21). The eighth embodiment, on the other hand, has the non-linear deemphasis characteristic, the transfer function thereof is represented by G(Z) of the formula (62), $G_3(Z)$ is represented by the formula (61), $G_1(Z)$ is represented by the formula (59) and $G_2(Z)$ is represented by the formula (60). From the formulas (42) and (61), we get $$H_{11}(Z) = G_3(Z) \quad (72)$$

From the formulas (21) and (60), we get $$H_3(Z) = G_2(Z) \quad (73)$$

Accordingly, by the non-linear emphasis characteristic of the circuit of FIG. 5 and the non-linear deemphasis characteristic of the circuit of FIG. 16, the first signal processing circuit 13 has a characteristic to output the input signal as it is, and the second signal processing circuit 15 has a high-pass filter characteristic as shown by the right side of the formula (21) or (60). The only difference lies in the characteristic of the non-linear signal processing circuit 14 and the operation function of the arithmetic operation circuit 16. In the present embodiment, the first signal processing circuit 13 has the characteristic to output the input signal as it is, and the second signal processing circuit 15 has the high-pass filter characteristic represented by the formula (21) or (60). The non-linear signal processing circuit 14 is configured as shown in FIG. 15, and the characteristic of the non-linear circuit 22 is switched by selecting the multiplier F of the formula (45) for the non-linear circuit 22a and the multiplier F' of the formula (63) for the non-linear circuit 22b, and the multiplier of the multiplier circuit is selected such that the multiplier K of the multiplier circuit 25a is set to X by the formula (21) and the multiplier K' of the multiplier circuit 25b is set at X/(1+X) by the formula (60). The arithmetic operation circuit 16 of FIG. 17 can select one of two operation functions such as the adder circuit 27 and the subtractor circuit 59. Thus, when the non-linear circuit 22a, the multiplier circuit 25a and the adder circuit 27 are selected, the present embodiment presents the non-linear emphasis characteristic of the formula (44), and when the non-linear circuit 22b, the multiplier circuit 25b and the subtractor circuit 59 are selected, the present embodiment presents the non-linear deemphasis characteristic shown by the formula (62).

In the present embodiment, since the non-linear emphasis characteristic and the non-linear deemphasis characteristic are attained by common circuit configuration, the circuit scale is reduced.

A 12th embodiment of the present invention is now described. The configuration of the present embodiment is similar to that of the 11th embodiment and shown in FIG. 17. The non-linear signal processing circuit 14 of FIG. 17 is similar to that of FIG. 15. The second signal processing circuit 15 outputs the input signal as it is. In the present embodiment, like the 11th embodiment, the non-linear emphasis characteristic and the non-linear deemphasis characteristic are selectively used. The operation is explained below.

The sixth embodiment has the non-linear emphasis characteristic, the transfer function thereof is given by H(Z) of the formula (51), and the first signal processing circuit 13 and the second signal processing circuit 15 each outputs the input signal as it is, the non-linear signal processing circuit 14 is configured as shown in FIG. 4 and has the transfer function of $H_{13}(Z)$ shown in the formula (49), the multiplier of the non-linear circuit 22 is equal to F in the formula (52), tbhe multiplier K of the multiplier circuit 25 is equal to X, and the arithmetic operation circuit 16 has the add function as shown by the adder circuit 27. The ninth embodiment has the non-linear deemphasis characteristic, the transfer function thereof is given by G(Z) in the formula (70), the first signal processing circuit 13 and the second signal processing circuit 15 in FIG. 16 each outputs the input signal as it is, the non-linear signal processing circuit 14 is configured as shown in 4 and has the transfer function $G_4(Z)$ shown in the formula (65), the multiplier of the non-linear circuit 22 is equal to F' of the formula (67), the multiplier of the multiplier circuit 25 is equal to K' of the formula (68), and the arithmetic operation circuit 16 has the subtract function as shown by the subtractor circuit 59. The difference between the configurations of the sixth and ninth embodiments resides in F and F', K and K' and the addition and the subtraction. Like in the 12th embodiment, the multiplier of the non-linear circuit 22 is selected between F and F', the multiplier of the multiplier circuit 25 is selected between K and K', and addition or subtraction is selected by the arithmetic operation circuit as shown in FIG. 17. Thus, when, F, K and addition are selected, the non-linear emphasis characteristic of H(Z) in the formula (51) is presented, and when F', K' and subtraction are selected, the non-linear deemphasis characteristic of G(Z) in the formula (70) is presented.

In the present embodiment, the non-linear emphasis characteristic and the non-linear deemphasis characteristic are attained in the same circuit configuration and the circuit scale is reduced, and in addition, the present embodiment is more effective in reducing the circuit scale than the 11th embodiment because the second signal processing circuit 15 of FIG. 17 outputs the input signal as it is.

In the 11th embodiment, the reverse characteristic 1/H(Z) of the non-linear emphasis characteristic H(Z) of the formula (44) does not correspond to the non-linear deemphasis characteristic G(Z) of the formula (62) because H(Z) of the formula (44) is derived from the approximation of the prior art non-linear emphasis characteristic for the purpose of simplification. However, in the present embodiment, the reverse characteristic 1/H(Z) of the non-linear emphasis characteristic H(Z) of the formula (51) is given by $$\frac{1}{H(Z)} = \frac{1}{1 + \dfrac{X \cdot \dfrac{TTd/\Delta}{(1+X)(T+Td)+TTd/\Delta}(1-Z^{-1})}{1 - \dfrac{TTd/\Delta}{(1+X)(T+Td)+TTd/\Delta}Z^{-1}}} \qquad (74)$$

$$= 1 - \frac{\dfrac{X}{1+X}\dfrac{TTd/\Delta}{T+Td+TTd/\Delta}(1-Z^{-1})}{1 - \dfrac{TTd/\Delta}{T+Td+TTd/\Delta}Z^{-1}}$$

which corresponds to the non-linear deemphasis characteristic G(Z) of the formula (70). Therefore, the present embodiment is more effective.

Figure 18:
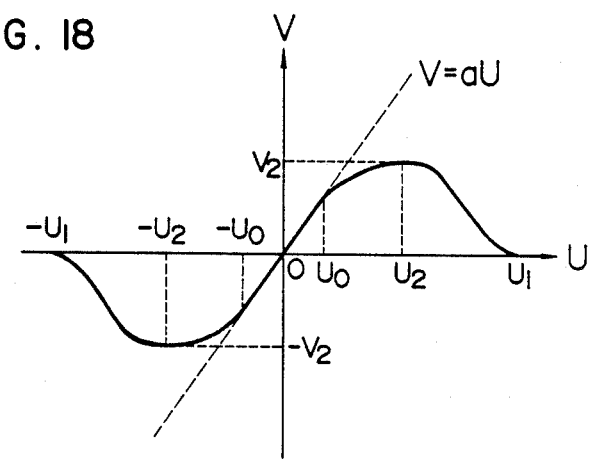
FIGS. 18, 20 and 21 show other input/output relationships in the non-linear signal processing apparatus of the present invention.

A 13th embodiment of the non-linear signal processing apparatus of the present invention is now explained. The configuration of the present embodiment is similar to that of FIG. 5, and the configuration of the non-linear signal processing circuit 14 of FIG. 5 is similar to that of FIG. 4. The input/output relationship of the non-linear circuit 22 of FIG. 4 has a characteristic as shown in FIG. 18. The operation is explained below.

In FIG. 4 which shows the non-linear signal processing circuit 14, a non-linear multiplier for determining the input/output relationship of the non-linear circuit 22 is given by P, a multiplier of the multiplier circuit 25 is given by Q and the delay times of the delay circuits 20 and 23 each is set to one sampling period $\Delta$. The transfer function E(Z) of the present embodiment is given by $$E(Z) = 1 + \frac{QP(1 - Z^{-1})}{1 - PZ^{-1}} \qquad (75)$$

From the input/output relationship of the non-linear circuit 22 of FIG. 18, the non-linear multiplier P is constant at a when the amplitude of the input U is smaller than $U_0$, but as it increase beyond $U_0$, P becomes smaller than a and is zero for an input having a magnitude larger than $U_1$. The amplitude of the input U when the amplitude of the output of the non-linear circuit 22 is maximum is given by $U_2$, and the amplitude of the output V is given by $V_2$. Since the second term of the right side of the formula (75) has the high-pass filter characteristic so long as P≠0, E(Z) of the formula (75) presents the non-linear emphasis characteristic which non-linearly emphasizes the high frequency component in accordance with the signal level.

In the present embodiment, it is assumed that a step signal which has a signal level of zero when $t=n\Delta<0$ and a signal level of Us when $t=n\Delta\leq 0$ is applied to the input terminal 12. Since the first signal processing circuit 13 and the second signal processing circuit 15 output the input signals as they are, the signal applied to the input terminal 12 is supplied, as it is, to the non-linear signal processing circuit 14, and the output signal of the non-linear signal processing circuit 14 is supplied, as it is, to the arithmetic operation circuit 16. Accordingly, the input step signal is supplied to the differential circuit 19 (FIG. 4) of the non-linear signal processing circuit 14. The output of the differential circuit 19 for the step signal is $U_{s1}$ at $t=0$ and zero at $t \neq 0$. The output of the non-linear circuit 22 which receives the output of the differential circuit 19 is explained with reference to the magnitude of the signal level $U_s$.

When $t<0$, the output of the differential circuit 19 is zero and the output of the non-linear circuit 22 is zero. The output of the delay circuit 23 is zero when $t \leq 0$. Accordingly, the input to the non-linear circuit 22 is zero when $t<0$ and $U_s$ when $t=0$. When $t>0$, the output of the differential circuit 19 is zero and the input to the non-linear circuit 22 is equal to the output of the delay circuit 23, that is, the output of the non-linear circuit 22 delayed by the time $\Delta$.

When $U_s<U_0$, the output of the non-linear circuit 22 is $aV_s$ when $t=0$, and $a^{n+1} \cdot U_s$ when $t=n\Delta>0$ (where n is an integer). Since $a<1$ to secure the stability of the system, the output of the non-linear circuit 22 attenuates by the factor of a for each time period $\Delta$, and a time constant thereof is determined by a.

When $U_0<U_s<U_1$, the output of the non-linear circuit 22 is $U_s$ attentuated by the factor of P at $t=0$, and $P<a$ as seen from FIG. 18. Accordingly, the attenuation is larger than when $U_s<U_0$, and a convergence time is shorter. After the output of the non-linear circuit 22 becomes smaller than $U_0$, the output attenuator by the factor of a for each time period $\Delta$.

When $U_s>U_1$, the output of the non-linear circuit 22 is zero at $t=0$ as seen from FIG. 18. Thus, the input to the non-linear circuit 22 is zero when $t>0$, and the output of the non-linear circuit 22 is zero.

The present embodiment which includes the non-linear circuit 22 having the input/output relationship shown in FIG. 18 presents the high frequency emphasis characteristic for a small level signal, and as the signal level increases, the emphasis is compressed and little high frequency emphasis is done to a large level signal. This characteristic is more to be preferred than the characteristic of the prior art (FIG. 2) for the non-linear emphasis characteristic used in the signal processing of a VTR or a video disk player (where the emphasis is compressed for a large level signal to prevent overemphasis and improve the S/N ratio in the high frequency band).

Figure 2:
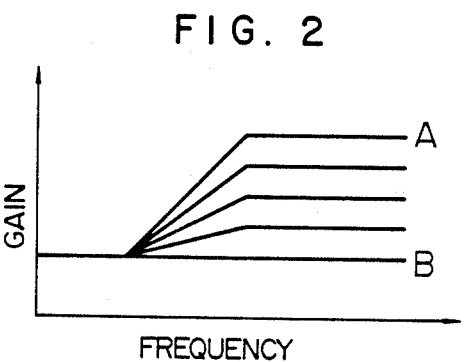
FIG. 2 shows a gain characteristic for non-linear emphasis.

The non-linear emphasis characteristic has a frequency characteristic which emphasizes the high frequency component as shown by A in FIG. 2. However, in order to assure that the overemphasis is not removed by a clipping circuit inserted after the non-linear emphasis circuit during the recording in the VTR or video disk but the signal is deemphasized by the non-linear deemphasis circuit during the reproduction, a characteristic as shown by B of FIG. 2 which does not emphasize the large level signal is required. However, in the prior art and the embodiments of the present invention which include the non-linear circuit 22 having the input/output relationship shown in FIG. 9, an infinite signal level is necessary to achieve the characteristic of B of FIG. 2. In actuality, the input signal of the maximum amplitude is overemphasized for the high frequency component. In the present embodiment, since the non-linear circuit 22 has the input/output relation shown in FIG. 18, $U_1$ is adjusted in accordance with the dynamic range of the input signal to prevent the overemphasis.

In the present embodiment, the first signal processing circuit 13 which outputs the input signal as it is, the second signal processing circuit which outputs the input signal as it is, and the non-linear signal processing circuit 14 which non-linearly compresses the time variation of the signal are provided, and the non-linear circuit 22 of the non-linear signal processing circuit 14 is imported with the input/output characteristic shown in FIG. 18 so that a non-linear emphasis characteristic which more effectively prevents overemphasis than the prior art non-linear emphasis characteristic is attained by the digital signal processing technique.

Figure 19:
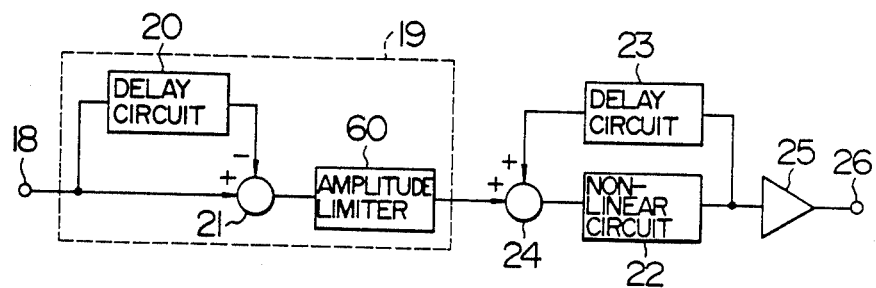
FIG. 19 is a block diagram of another non-linear signal processing circuit for the non-linear signal processing apparatus of the present invention.

A 14th embodiment of the non-linear signal processing apparatus of the present invention is now explained. The configuration of the present embodiment is similar to that of the 13th embodiment of FIG. 5 but the differential circuit 19 of the non-linear signal processing circuit 14 of FIG. 4 differs. FIG. 19 shows a configuration of the non-linear signal processing circuit 14 of the present embodiment. It comprises an amplitude limiter circuit 60 in the differential circuit 19 (FIG. 4) used in the 13th embodiment. The amplitude limiter circuit 60 limits the signal level of the output of the subtractor circuit 21 so that the input/output dynamic range of the adder circuit 24 and the input dynamic range of the non-linear circuit 22 in the succeeding stage can be reduced. The operation is explained below.

Since the maximum signal level of the output V of the non-linear circuit 22 is $V_2$ as seen from FIG. 18, the maximum level of the output of the delay circuit 23 is also $V_2$. Since the output V is zero when the signal level of the input U to the non-linear circuit 22 is higher than $U_1$ as seen from FIG. 18, the output of the non-linear circuit 22 is always zero if the output of the adder circuit 24 which combines the output of the delay circuit 23 and the output of the differential circuit 19 is larger than the signal level $U_1$. Because the maximum level of the output of the delay circuit 23 is $V_2$, the output of the non-linear circuit 22 is always zero if the signal level of the output of the differential circuit 19 is larger than $U_1+V_2$. Accordingly, the output dynamic range of the differential circuit 19 need not be larger than $U_1+V_2$.

In the present embodiment, the amplitude limiter circuit 60 is provided in the differential circuit 19 so that the input/output dynamic range of the adder circuit 24, particularly the input dynamic range of the non-linear circuit 22 are reduced without changing the characteristic. Accordingly, the circuit scale is reduced significantly.

A 15th embodiment of the non-linear signal processing apparatus of the present invention is now described. The configuration of the present embodiment is similar to that of FIG. 16. The first signal processing circit 13 and the second signal processing circuit 15 of FIG. 16 each outputs the input signal as it is. The configuration of the non-linear signal processing circuit 14 is similar to that of FIG. 4. The input/output relationship of the non-linear circuit 22 of FIG. 4 is such that the output of the non-linear circuit is zero when the amplitude of the input to the non-linear circuit 22 is large, as shown in FIG. 18. The operation is described below.

The non-linear multiplier of the non-linear circuit 22 of FIG. 4 is given by P', the multiplier of the multiplier circuit 25 is given by Q' and the delay times of the delay circuits 20 and 23 each is given by $\Delta$. Thus, the transfer function D(Z) of the present embodiment is given by $$D(Z) = 1 - \frac{Q'P'(1 - Z^{-1})}{1 - P'Z^{-1}} \quad (76)$$

The transfer function E(Z) of the 13th embodiment is shown in the formula (75). The reverse characteristic 1/E(Z) of the transfer function E(Z) is represented by $$1/E(Z) = 1 - \frac{\frac{Q}{1+Q} \cdot \frac{(1+Q)P}{1+QP}(1 - Z^{-1})}{1 - \frac{(1+Q)P}{1+QP} Z^{-1}} \quad (77)$$

In the formula (77), P is the non-linear multiplier to represent the input/output relationship of FIG. 18 and Q is constant. Accordingly, the input/output relationship multiplied by $(1+Q)\cdot P/(1+QP)$ is similar to FIG. 18 and $Q/(1+Q)$ is constant. Thus, by selecting P′ and Q′ in the transfer function D(Z) of the present embodiment to $$P' = \frac{(1 + Q)P}{1 + QP} \quad (78)$$

$$Q' = \frac{Q}{1 + Q} \quad (79)$$

the non-linear signal processing apparatus of the present embodiment presents the non-linear deemphasis characteristic which deemphasizes the signal emphasized by the non-linear emphasis characteristic of the 13th embodiment.

In the present embodiment, the non-linear deemphasis characteristic which deemphasizes the signal emphasized by the characteristic of the 13th embodiment which has smaller over emphasis than the prior art non-linear emphasis characteristic is attained by the digital signal processing technique.

The present embodiment has been described as one which presents the reverse characteristic of the 13th embodiment. When the present embodiment is used singly, it is effective as a noise elimination device for suppressing a low level high frequency noise superimposed on a video signal. In a prior art noise elimination device, it is usual to limit the amplitude of the high frequency component of the signal passed through the high-pass filter to extract the low level high frequency component as a noise component and substract the noise component from the original signal. In this device, however, the high level high frequency component at an edge portion where the signal level largely changes is distorted although it is amplitude-limited. It is difficult to compensate for such distortion. Therefore, the noise elimination is inhibited for a time period in which the high frequency component which is larger than the amplitude limit level may be included.

In accordance with the characteristic D(Z) (formula (76)) of the present embodiment, if the input amplitude is larger than the predetermined level ($U_1$ in FIG. 18), the output of the non-linear circuit 22 is zero as shown in FIG. 18. Accordingly, it is not subtracted from the original signal by the subtractor circuit 59 of FIG. 16 (arithmetic operation circuit 16). Accordingly, the noise elimination without distortion can be attained for the signal including the high frequency component such as signal at the edge.

Figure 20:
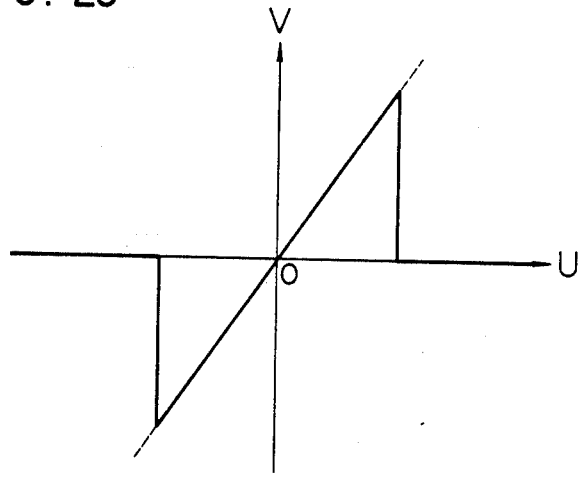
Figure 21:
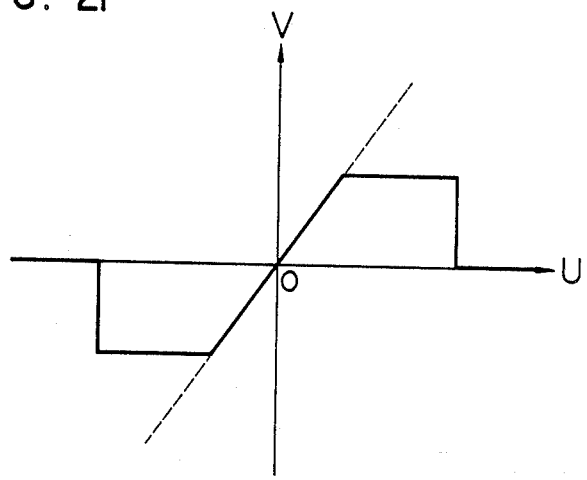

In the present embodiment, the non-linear circuit 22 has such a characteristic that the output is zero for the large level signal so that the noise elimination device which can effectively eliminate only the low level noise component without signal distortion is attained by the digital signal processing technique. The input/output characteristic of the non-linear circuit 22 of the present embodiment which functions as the noise elimination device may have such a characteristic that it is linear until a predetermined input level is reached and the output is zero when the input level is larger as shown in FIG. 20, or a characteristic as shown in FIG. 21 which linearly approximates the characteristic of FIG. 18. The input/output characteristics of FIGS. 20 and 21 can be easily implemented by a multiplier circuit, an adder/subtractor circuit and a switch circuit, but the noise elimination level abruptly changes by the change of the signal level and the output includes an unnatural change. Accordingly, the input/output characteristic of FIG. 18 is preferable.

In the present embodiment, the differential circuit 19 of the non-linear signal processing circuit 14 may comprise the amplitude limiter circuit 60 as it does in the 14th embodiment of FIG. 19. In this case, the dynamic ranges of the adder circuit 24 and the non-linear circuit 22 can be reduced without changing the non-linear emphasis characteristic or the noise elimination characteristic of the present embodiment and hence the circuit scale can be reduced as in the 14th embodiment.

The configurations of the 13th and 15th embodiments are explained. The configuration of the 13th embodiment which functions as the non-linear emphasis circuit is shown in FIG. 5, and the configuration of the 15th embodiment which functions as the non-linear deemphasis circuit is shown in FIG. 16. In FIGS. 5 and 16, the first signal processing circuit 13 and the second signal processing circuit 15 each outputs the input signal as it is, and the non-linear circuit 14 is configured as shown in FIG. 14. The characteristics of the 13th and 15th embodiments are represented by E(Z) of the formula (75) and D(Z) of the formula (76), respectively. It is apparent from the above that the characteristics of E(Z) and D(Z) are determined by P, Q and P′, Q″, respectively. Accordingly, since the non-linear signal processing circuit 14 has the non-linear circuit 22 and the multiplier circuit 25 of multiple characteristics as shown in FIG. 15 and selectively uses them, a plurality of non-linear emphasis or deemphasis characteristics such as those the NTSC and PAL systems can be attained by the same configuration, as is done in the seventh and 10th embodiments. Since the differential circuit 19 of FIG. 15 has the amplitude limiter circuit 60 as shown in FIG. 19, the dynamic ranges of the adder circuit 24 and the non-linear circuit 22 in the succeeding stage can be reduced and hence the circuit scale can be reduced, as was explained in the 14th embodiment.

In the non-linear signal processing apparatus of FIG. 17 which includes the non-linear signal processing circuit 14 of FIG. 15, the non-linear emphasis and deemphasis characteristics of the 13th and 15th embodiments can be attained in the same configuration by selecting the characteristics (P, P′) of the non-linear circuit 22, the multiplier (Q, Q′) of the multiplier circuit 25 and the operation (addition, subtraction) of the arithmetic operation circuit 16, as is done in the 12th embodiment.

The non-linear emphasis and deemphasis characteristics in the first to 12th embodiments and the non-linear emphasis and deemphasis characteristics in the 13th to 15th embodiments are additionally explained.

The characteristics of the first to 12th embodiments are approximations of the non-linear emphasis characteristic in the prior art. When they are used in a VTR or video disk player, a signal which was non-linearly emphasized by the prior art can be deemphasized by the non-linear deemphasis characteristic of the embodiment of the present invention, and a signal emphasized by the non-linear emphasis characteristic of the embodiment of the present invention can be deemphasized by the characteristic of the prior art. Thus, those embodiments are compatible with the prior art.

On the other hand, the 13th to 15th embodiments are incompatible with the prior art non-linear emphasis and deemphasis characteristics but have improved characteristics in that they prevent overemphasis, which is an inherent object of the non-linear characteristic, and they are attained by the digital signal processing technique which is superior in implementing the apparatus by IC from the standpoints of integrity and safety.

In the non-linear signal processing apparatus of the present invention shown in the block diagrams of FIGS. 3, 5, 16 and 17, the first signal processing circuit 13 has the characteristic to output the input singal as it is. This means that the input signal applied to the input terminal 12 is supplied to the non-linear signal processing circuit 14 and the first signal processing circuit 13 does not exist. Similarly, the second signal processing circuit 15 also outputs the input signal as it is. This means that the output of the non-linear signal processing circuit 14 is supplied to the arithmetic operation circuit 16 and the second signal processing circuit 15 does not exist.

What we claim is:

1. A non-linear signal processing apparatus comprising:
    a first signal processing circuit for processing an apparatus input signal in a predetermined manner to provide an output signal;
    a non-linear signal processing network including a differential circuit for generating an output signal by extracting a variation in a predetermined time period from the output signal of said first signal processing circuit, a non-linear circuit for receiving an input signal and for generating in response thereto an output signal having an amplitude that is non-linearly compressed in accordance with the amplitude of the input signal to the non-linear circuit, a delay circuit for generating an output signal by delaying the output signal of said non-linear circuit by a predetermined time period, an adder circuit for combining the output signal of said delay circuit and the output signal of said differential circuit and supplying the combined signal to said non-linear circuit as the input signal received by the non-linear circuit, and a multiplier circuit for multiplying the output signal of said non-linear circuit by a predetermined factor to provide an output signal of said non-linear signal processing network, wherein said non-linear circuit has a multiplication factor that is non-linear, said output signal of said non-linear circuit being not only outputted through said multiplier circuit to exhibit a first compression effect, but also being fed back through said delay circuit to increase a second compression effect;
    a second signal processing circuit for processing the output signal of said non-linear signal processing network in a predetermined manner to provide an output signal; and
    an arithmetic operation circuit for arithmetically combining the output signal of said second signal processing circuit and said apparatus input signal.

2. A non-linear signal processing apparatus according to claim 1 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude.

3. A non-linear signal processing apparatus according to claim 2 wherein said arithmetic operation circuit adds the output signal of said second signal processing circuit and said apparatus input signal.

4. A non-linear signal processing apparatus according to claim 3 wherein said first signal processing circuit has an emphasis characteristic and said second signal processing circuit has a high-pass filter characteristic.

5. A non-linear signal processing apparatus according to claim 3 wherein said first signal processing circuit has a high-pass filter characteristic and said second signal processing circuit has a high-pass filter characteristic.

6. A non-linear signal processing apparatus according to claim 2 wherein said arithmetic operation circuit subtracts the output of said second signal processing circuit from said apparatus input signal.

7. A non-linear signal processing apparatus according to claim 2 wherein said arithmetic operation circuit comprises means for selectively adding the output signal of said second signal processing circuit to said apparatus input signal and for selectively subtracting the output signal of said second signal processing circuit from said apparatus input signal.

8. A non-linear signal processing apparatus according to claim 1 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, and as the amplitude of the input signal becomes still larger, said non-linear circuit produces an output signal sufficiently compressed or produces no output.

9. A non-linear signal processing apparatus according to claim 8 wherein said differential circuit limits the amplitude of the variation when the amplitude of the variation is higher than a predetermined level.

10. A non-linear signal processing apparatus comprising:
    a first signal processing circuit for processing an apparatus input signal in a predetermined manner to provide an output signal;
    a non-linear signal processing network including a differential circuit for generating an output signal by extracting a variation in a predetermined time period from the output signal of said first signal processing circuit, a non-linear circuit for receiving an input signal and for generating in response thereto an output signal having an amplitude that is non-linearly compressed in accordance with the amplitude of the input signal to the non-linear circuit, a delay circuit for generating an output signal by delaying the output signal of said non-linear circuit by a predetermined time period, an adder circuit for combining the output signal of said delay circuit and the output signal of said differential circuit and supplying the combined signal to said non-linear circuit as the input signal received by the non-linear circuit, and a multiplier circuit for multiplying the output signal of said non-linear circuit by a predetermined factor to provide an output signal of said non-linear processing network, wherein said non-linear circuit has a multiplication factor that is non-linear, said output signal of said non-linear circuit being not only outputted through said multiplier circuit to exhibit a first compression effect, but also being fed back through said delay circuit to increase a second compression effect; and an arithmetic operation circuit for arithmetically combining the output signal of said non-linear signal processing network and said apparatus input signal.

11. A non-linear signal processing apparatus according to claim 10 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, and wherein said arithmetic operation circuit adds the output signal of said non-linear signal processing network and said apparatus input signal, and said first signal processing circuit has an emphasis characteristic.

12. A non-linear signal processing apparatus according to claim 10 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having a larger amplitude, and wherein said arithmetic operation circuit adds the output signal of said non-linear signal processing circuit and said apparatus input signal, and said first signal processing circuit has a high-pass filter characteristic.

13. A non-linear signal processing apparatus comprising:
a non-linear signal processing network including a differential circuit for generating an output signal by extracting a variation in a predetermined time period from an input signal thereto, a non-linear circuit for receiving another input signal and for generating in response thereto an output signal having an amplitude that is non-linearly compressed in accordance with the amplitude of the input signal to the non-linear circuit, a delay circuit for generating an output signal by delaying the output signal of said non-linear circuit by a predetermined time period, an adder circuit for combining the output signal of said delay circuit and the output signal of said differential circuit and supplying the combined signal to said non-linear circuit as the input signal received by the non-linear circuit, and a multiplier circuit for multiplying the output signal of said non-linear circuit by a predetermined factor to provide an output signal of said non-linear signal processing network, wherein said non-linear circuit has a multiplication factor that is non-linear, said output signal of said non-linear circuit being not only outputted through said multiplier circuit to exhibit a first compression effect, but also being fed back through said delay circuit to increase a second compression effect;

a signal processing circuit for processing the output signal of said non-linear signal processing network in a predetermined manner to provide an output signal; and an arithmetic operation circuit foor arithmetically combining the output signal of said signal processing circuit and said input signal to said differential circuit.

14. A non-linear signal processing apparatus according to claim 13 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than said predetermined amplitude, wherein said arithmetic operation circuit adds the output signal of said signal processing circuit and said input signal to said differential circuit, and wherein said signal processing circuit has a high-pass filter characteristic.

15. A non-linear signal processing apparatus according to claim 13 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, wherein said arithmetic operation circuit subtracts the output signal of said signal processing circuit from said input signal to said differential circuit, and wherein said signal processing circuit has a high-pass filter characteristic.

16. A non-linear signal processing apparatus according to claim 13 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, wherein said arithmetic operation circuit comprises means for selectively adding the output signal of said signal processing circuit and said input signal to said differential circuit and for selectively subtracting the output signal of said signal processing circuit from said input signal to said differential circuit, and wherein said signal processing circuit has a high-pass filter characteristic.

17. A non-linear signal processing apparatus according to claim 16 wherein said non-linear circuit has two different compression characteristics for compressing the amplitude of the output signal of the non-linear circuit in accordance with the amplitude of the input signal to the non-linear circuit, and wherein said multiplier circuit has two different multipliers, said two characteristics of said non-linear circuit and said two multipliers of said multiplier circuit being selectively used.

18. A non-linear signal processing apparatus according to claim 17 wherein the characteristic of said apparatus presented when one of the two characteristics of said non-linear circuit, one of the two multipliers of said multiplier circuit and one of the adding and subtracting functions of said arithmetic operation circuit are selected, and the characteristic of said apparatus presented when others of those characteristics, multipliers and functions are selected, are reversed from each other.

19. A non-linear signal processing apparatus comprising:

a non-linear signal processing network including a differential circuit for generating an output signal by extracting a variation in a predetermined time period from an input signal thereto, a non-linear circuit for receiving another input signal and for generating in response thereto an output signal having an amplitude that is non-linearly compressed in accordance with the amplitude of the input signal to the non-linear circuit, a delay circuit for generating an output signal by delaying the output signal of said non-linear circuit by a predetermined time period, an adder circuit for combining the output signal of said delay circuit and the output signal of said differential circuit and supplying the combined signal to said non-linear circuit as the input signal received by the non-linear circuit, and a multiplier circuit for multiplying the output signal of said non-linear circuit by a predetermined factor to provide an output signal of said non-linear signal processing network, wherein said non-linear circuit has a multiplication factor that is non-linear, said output signal of said non-linear circuit being not only outputted through said multiplier circuit to exhibit a first compression effect, but also being fed back through said delay circuit to increase a second compression effect; and an arithmetic operation circuit for arithmetically combining the output signal of said non-linear signal processing network and said input signal to said differential circuit.

20. A non-linear signal processing apparatus according to claim 19 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, and wherein said arithmetic operation circuit adds the output signal of said non-linear signal processing network and said input signal to said differential circuit.

21. A non-linear signal processing apparatus according to claim 20 wherein said non-linear circuit has a plurality of different compression characteristics to compress the amplitude of the output signal of the non-linear circuit in accordance with the amplitude of the input signal to the non-linear circuit, and said multiplier circuit has a plurality of different multipliers, said different characteristics of said non-linear circuit and said different multipliers of said multiplier circuit being selectively used.

22. A non-linear signal processing apparatus according to claim 19 wherein said non-linear circuit produces an output signal compressed at a constant compression factor when an amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, and wherein said arithmetic operation circuit subtracts the output signal of the non-linear signal processing circuit from said input signal to said differential circuit.

23. A non-linear signal processing apparatus according to claim 22 wherein said non-linear circuit has a plurality of different compression characteristics to compress the amplitude of the output signal of the non-linear circuit in accordance with the amplitude of the input signal to the non-linear circuit, and said multiplier circuit has a plurality of different multipliers, said different characteristics of said non-linear circuit and said different multipliers of said multiplier circuit being selectively used.

24. A non-linear signal processing apparatus according to claim 19 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, the amplitude of the output signal for an input signal of predetermined amplitude being no larger than the amplitude of the output signal for an input signal having an amplitude larger than the predetermined amplitude, and wherein said arithmetic operation circuit comprises means for selectively adding the output signal of said non-linear signal processing network and said input signal to said differential circuit and for selectively subtracting the output signal of said non-linear signal processing network from said input signal to said differential circuit.

25. A non-linear signal processing apparatus according to claim 24 wherein said non-linear circuit has two different compression characteristics to compress the amplitude of the output signal of the non-linear circuit in accordance with the amplitude of the input signal to the non-linear circuit, and said multiplier circuit has two different multipliers, said different characteristics of said non-linear circuit and said different multipliers of said multiplier circuit being selectively used.

26. A non-liner signal processing apparatus according to claim 25 wherein the characteristic of said apparatus presented when one of the two characteristics of said non-linear circuit, one of the two multipliers of said multiplier circuit and one of the adding and subtracting functions of said arithmetic operation circuit are selected, and the characteristic of said apparatus presented when others of those characteristics, multipliers and functions are selected, are reversed from each other.

27. A non-linear signal processing apparatus according to claim 19 wherein said non-linear circuit produces an output signal compressed at a constant compression factor when the amplitude of the input signal applied to said non-linear circuit is small, and as the amplitude of the input signal increases, said nonlinear circuit produces an output signal compressed at a larger compression factor than said constant compression factor, and as the amplitude of the input signal to the non-linear circuit becomes larger still, said non-linear circuit produces an output signal sufficiently compressed or produces no output, and said arithmetic operation circuit adds the output signal of said non-linear signal processing network and said input signal to said differential circuit.

28. A non-linear signal processing apparatus according to claim 27 wherein said non-linear circuit has a plurality of different compression characteristics for compressing the amplitude of the output signal to the non-linear circuit in accordance with the amplitude of the input signal to the non-linear circuit, and said multiplier circuit has a plurality of different multipliers, said different characteristics of said non-linear circuit and said different multipliers of said multiplier circuit being selectively used.

29. A non-linear signal processing apparatus according to claim 19 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, and as the amplitude of the input signal becomes larger still, said non-linear circuit produces an output signal sufficiently compressed or produces no output, and wherein said arithmetic operation circuit subtracts the output signal of said non-linear signal processing network from said input signal to said differential circuit.

30. A non-linear signal processing apparatus according to claim 29 wherein said non-linear circuit has a plurality of different compression characteristics for compressing the amplitude of the output signal of the non-linear circuit in accordance with the amplitude of the input signal to the non-linear circuit, and said multiplier circuit has a plurality of different multipliers, said different characteristics of said non-linear circuit and said different multipliers of said multiplier circuit being selectively used.

31. A non-linear signal processing apparatus according to claim 19 wherein said non-linear circuit produces an output signal compressed at a constant compression factor when the amplitude of the input signal applied to said non-linear circuit is small, and as the amplitude of the input signal increases, said non-linear circuit produces an output signal compressed at a larger compression factor than said constant compression factor, and as the amplitude of the input signal becomes larger still, said non-linear circuit produces an output signal sufficiently compressed or produces no output, and wherein said arithmetic operation circuit comprises means for selectively adding the output signal of said non-linear signal processing network and said input signal to said differential circuit and for selectively subtracting the output signal of said non-linear signal processing network from said input signal to said differential circuit.

32. A non-linear signal processing apparatus according to claim 31 wherein said non-linear circuit has a plurality of different compression characteristics to compress the amplitude of the output signal to the non-linear circuit in accordance with the amplitude of the input signal to the non-linear circuit, and wherein said multiplier circuit has a plurality of different multipliers, said different characteristics of said nonlinear circuit and said different multipliers of said multiplier circuit being selectively used.

33. A non-linear signal processing apparatus according to claim 32 wherein the characteristic of said apparatus presented when one of the plurality of characteristics of said non-linear circuit, one of the plurality of multipliers of said multiplier circuit and one of the adding and subtracting functions of said arithmetic operation circuit are selected, and the characteristic of said apparatus presented when others of those characteristics, multipliers and functions are selected, are reversed from each other.

34. A non-linear signal processing apparatus according to claim 27, wherein said differential circuit limits the amplitude of the variation in the predetermined time when the amplitude of the variation is larger than a predetermined level.

35. A non-linear signal processing apparatus according to claim 28, wherein said differential circuit limits the amplitude of the variation in the predetermined time when the amplitude of the variation is larger than a predetermined level.

36. A non-linear signal processing apparatus according to claim 29, wherein said differential circuit limits the amplitude of the variation in the predetermined time when the amplitude of the variation is larger than a predetermined level.

37. A non-linear signal processing apparatus according to claim 30, wherein said differential circuit limits the amplitude of the variation in the predetermined time when the amplitude of the variation is larger than a predetermined level.

38. A non-linear signal processing apparatus according to claim 31, wherein said differential circuit limits the amplitude of the variation in the predetermined time when the amplitude of the variation is larger than a predetermined level.

39. A non-linear signal processing apparatus according to claim 32, wherein said differential circuit limits the amplitude of the variation in the predetermined time when the amplitude of the variation is larger than a predetermined level.

40. A non-linear signal processing apparatus according to claim 33, wherein said differential circuit limits the amplitude of the variation in the predetermined time when the amplitude of the variation is larger than a predetermined level.

41. An apparatus for non-linearly processing an apparatus input signal, comprising:
first signal processing means for processing the apparatus input signal in a predetermined manner to provide a first intermediate signal;

a non-linear signal processing network which includes differential circuit means, responsive to the first intermediate signal, for delaying the first intermediate signal and for generating a second intermediate signal which corresponds to the difference between the first intermediate signal and the delayed first intermediate signal, an adder having a pair of input ports and having an output port, one of the input ports of the adder receiving the second intermediate signal, non-linear circuit means, having an input port that is connected to the output port of the adder to receive an output signal from the adder, for generating a third intermediate signal that is a non-linear function of the output signal from the adder, delay circuit means for feeding back the third intermediate signal to the other input port of the adder after a predetermined delay, and multiplier circuit means for multiplying the third intermediate signal by a predetermined factor to provide a fourth intermediate signal;

second signal processing means for processing the fourth intermediate signal in a predetermined manner to provide a fifth intermediate signal; and arithmetic operation circuit means for arithmetically combining the apparatus input signal and the fifth intermediate signal.

* * * * *